US006849377B2

(12) United States Patent
Feiring et al.

(10) Patent No.: US 6,849,377 B2
(45) Date of Patent: *Feb. 1, 2005

(54) PHOTORESISTS, POLYMERS AND PROCESSES FOR MICROLITHOGRAPHY

(75) Inventors: Andrew E. Feiring, Wilmington, DE (US); Frank L. Schadt, III, Wilmington, DE (US)

(73) Assignee: E. I. du Pont de Nemours and Company, Wilmington, DE (US)

(*) Notice: Subject to any disclaimer, the term of this patent is extended or adjusted under 35 U.S.C. 154(b) by 32 days.

This patent is subject to a terminal disclaimer.

(21) Appl. No.: 10/108,935

(22) Filed: Mar. 27, 2002

(65) Prior Publication Data

US 2004/0023150 A1 Feb. 5, 2004

Related U.S. Application Data

(63) Continuation-in-part of application No. 09/806,096, filed on Mar. 23, 2001, now Pat. No. 6,593,058, which is a continuation of application No. PCT/US99/21912, filed on Sep. 21, 1999.
(60) Provisional application No. 60/280,268, filed on Mar. 30, 2001, and provisional application No. 60/101,502, filed on Sep. 23, 1998.

(51) Int. Cl.[7] .......................... G03C 1/73; G03F 7/038; G03F 7/039; G03F 7/30; C08F 214/18
(52) U.S. Cl. .................... 430/270.1; 430/325; 430/326; 430/907; 430/914; 430/271.1; 430/272.1; 430/331; 526/242; 526/245; 526/243; 526/248; 526/249; 526/250; 526/253; 526/255
(58) Field of Search .................... 526/242, 253, 526/243, 248, 249, 245, 250, 255, 270.1, 325, 326, 907, 914, 271.1, 272.1; 430/270.1, 325, 326, 907, 914, 271.1, 272.1, 331

(56) References Cited

U.S. PATENT DOCUMENTS

| | | | |
|---|---|---|---|
| 3,287,327 A | 11/1966 | Zutty | |
| 3,444,148 A | 5/1969 | Adelman | |
| 3,650,885 A | 3/1972 | Nass et al. | |
| 4,365,049 A | 12/1982 | Tsunoda et al. | |
| 4,421,843 A | 12/1983 | Hattori et al. | |
| 4,508,814 A | 4/1985 | Sakurai et al. | |
| 4,538,250 A | 8/1985 | Fujii et al. | |
| 4,551,414 A | 11/1985 | Asmussen et al. | |
| 4,686,168 A | 8/1987 | Fujii et al. | |
| 4,732,843 A | 3/1988 | Budde et al. | |
| 4,751,168 A | 6/1988 | Tsuchiya et al. | |
| 4,752,635 A | 6/1988 | Tsutsumi et al. | |
| 4,800,151 A | 1/1989 | Kataoka et al. | |
| 4,842,989 A | 6/1989 | Taniguchi et al. | |
| 4,876,322 A | 10/1989 | Budde et al. | |
| 4,943,653 A | 7/1990 | Morita et al. | |
| 4,963,471 A | 10/1990 | Trout et al. | |
| 4,965,158 A | 10/1990 | Gruber et al. | |
| 4,983,495 A | 1/1991 | Tsutsumi et al. | |
| 5,112,973 A | 5/1992 | Morita et al. | |
| 5,117,035 A | 5/1992 | Morita et al. | |
| 5,157,091 A | 10/1992 | Masataka et al. | |
| 5,177,166 A | 1/1993 | Kobo et al. | |
| 5,192,643 A | 3/1993 | Kotachi et al. | |
| 5,229,473 A | 7/1993 | Kobo et al. | |
| 5,275,908 A | 1/1994 | Elsaesser et al. | |
| 5,399,647 A | 3/1995 | Nozaki | |
| 5,426,164 A | 6/1995 | Babb et al. | |
| 5,655,627 A | 8/1997 | Horne et al. | |
| 5,665,527 A | 9/1997 | Allen et al. | |
| 5,733,707 A | 3/1998 | Kobayashi | |
| 5,843,624 A | 12/1998 | Houlihan | |
| 5,958,648 A | 9/1999 | Nishimura et al. | |
| 5,962,612 A | 10/1999 | Takakura et al. | |
| 6,030,747 A | 2/2000 | Nakano et al. | |
| 6,136,499 A | 10/2000 | Goodall et al. | |
| 6,335,143 B1 | 1/2002 | Sumino et al. | |
| 6,593,058 B1 * | 7/2003 | Feiring et al. | ........... 430/270.1 |

FOREIGN PATENT DOCUMENTS

| | | | |
|---|---|---|---|
| DE | 4207263 A1 | 9/1993 | |
| DE | 4207264 A1 | 9/1993 | |

(List continued on next page.)

OTHER PUBLICATIONS

Introduction to Microliethography, Second Edition by L. F. Thompson, C.G. Willson, and M. J.Bowden, American Chemical Society, Washington, DC (1994) Chapter 3.

F. M. Houlihan et al., Macromolecules, 30, pp. 6517–6524.

F. M. Houlihan et al., Journal of Photopolymer Science and Technology, 10, No. 3, pp. 511–520 (1997).

T. Wallow et al., SPIE, vol. 2724, pp. 355–364.

U. Okoroanyanwu et al., SPIE, vol. 3049, pp. 92–103.

R. Allen et al., SPIE, vol. 2724, pp. 334–343.

Semiconductor International, Sep. 1997, pp. 74–80.

(List continued on next page.)

Primary Examiner—Cynthia H. Kelly
Assistant Examiner—Sin J. Lee

(57) ABSTRACT

Photoresists and associated processes for microlithography in the extreme, far, and near UV are disclosed. The photoresists in some embodiments comprise (a) a fluorine-containing copolymer derived from at least one polycyclic ethylenically unsaturated compound and at least one compound having at least one fluorine atom covalently attached to an ethylenically unsaturated carbon atom; and (b) at least one photoactive component. In other embodiments, the photoresists comprise a fluorine-containing copolymer derived from at least one polycyclic ethylenically unsaturated compound having at least one atom or group covalently attached to a carbon atom contained within a ring structure and separated from each ethylenically unsaturated carbon atom of the ethylenically unsaturated compound by at least one covalently attached carbon atom, wherein the atom or group is selected from the group consisting of fluorine perfluoroalkyl and perfluoroalkoxy.

20 Claims, No Drawings

FOREIGN PATENT DOCUMENTS

| | | | |
|---|---|---|---|
| DE | 4319178 | A1 | 12/1993 |
| EP | 0240726 | A2 | 10/1987 |
| EP | 0 437 619 | A | 7/1991 |
| EP | 0789278 | A2 | 8/1997 |
| EP | 0794458 | A2 | 9/1997 |
| EP | 0843218 | A1 | 5/1998 |
| EP | 0880075 | A1 | 11/1998 |
| FR | 2573069 | A1 | 5/1986 |
| FR | 2623510 | A1 | 5/1989 |
| GB | 1487936 | | 10/1977 |
| JP | 54046286 | | 4/1979 |
| JP | 5833246 | | 2/1983 |
| JP | 62186907 | A2 | 8/1987 |
| JP | 63158541 | | 7/1988 |
| JP | 63271249 | | 11/1988 |
| JP | 6429837 | | 1/1989 |
| JP | 1118127 | | 5/1989 |
| JP | 1276129 | | 11/1989 |
| JP | 2202904 | | 8/1990 |
| JP | 3226756 | | 10/1991 |
| JP | 03281664 | | 12/1991 |
| JP | 4171452 | | 6/1992 |
| JP | 5127377 | | 5/1993 |
| JP | 943856 | | 2/1997 |
| JP | 97043856 | | 2/1997 |
| JP | 10142779 | | 5/1998 |
| JP | 10207052 | | 8/1998 |
| WO | WO 9733198 | | 9/1997 |
| WO | WO 9840789 | | 9/1998 |
| WO | WO 00 17712 | A | 3/2000 |
| WO | WO 0066575 | | 11/2000 |
| WO | WO 0067072 | | 11/2000 |

OTHER PUBLICATIONS

J. Niu and J. Frechet, Angew. Chem. Int. Ed., 37, No. 5, (1998), pp. 667–670.

"Synthesis of Cycloolefin–Maleic Anhydride Alternating Copolymers for 193 nm Imaging" F.M. Houlihan et al., Macromolecules 1997, 30, pp. 6517–6524 (1997).

"Pd(II)–catalyzed addition polymerization and ring opening metathesis polymerization of alicyclic monomers: routes to new matrix resins for 193 nm photolithography" U. Okoroanyanwu et al., J. of Molecular Catalysis A: Chemical 133, pp. 93–114 (1998).

"Dry Etch Resistance of Organic Materials" H. Gokan et al., J. Electrochem. Soc., Solid–State Sci. Technology, 130, pp. 143–146 (1983).

"Synthesis and Evaluation of Alicyclic Backbone Polymers for 193 nm Lithography" H. Ito et al., Chapter 16, American Chemical Society Symposium Series, V. 706, pp. 208–223 (Jan. 9, 1998).

"Synthesis and Preliminary Evaluation of Substituted Poly(Norbornene Sulfones) for 193 nm Lithography" Polymerica Materials Science and Engineering, 77, 449–450 (1997).

"Hexafluoracetone in Resist Chemistry: A Versatile New Concept for Materials for Deep UV Lithography" K.J. Przybilla et al., Proceedings of SPIE–The Internatnational Society for Optical Engineering, vol. 1672, Proceedings of Mar. 9–10, 192, San Jose, CA p. 500–512.

"Liquid Separation with Fluorinated Polymer Membranes" M. Nakamura et al., J. Membrane Science, 36, 343–351 (1988) (Abstract only).

* cited by examiner

PHOTORESISTS, POLYMERS AND PROCESSES FOR MICROLITHOGRAPHY

RELATED APPLICATIONS

This is a continuation-in-part of U.S. Ser. No. 09/806,096 filed on Mar. 23, 2001 now U.S. Pat. No. 6,593,058 which is incorporated by reference in its entirety.

Provisional application Ser. No. 60/280,268 filed on Mar. 30, 2001 is herein incorporated by reference in its entirety.

BACKGROUND OF THE INVENTION

1. Field of the Invention

The present invention pertains to photoimaging and, in particular, the use of photoresists (positive-working and/or negative-working) for imaging in the production of semiconductor devices. The present invention also pertains to novel fluorine-containing polymer compositions which are useful as base resins in resists and potentially in many other applications.

2. Description of Related Art

Polymer products are used as components of imaging and photosensitive systems and particularly in photoimaging systems such as those described in *Introduction to Microlithography, Second Edition* by L. F. Thompson, C. G. Willson, and M. J. Bowden, American Chemical Society, Washington, D.C., 1994. In such systems, ultraviolet (UV) light or other electromagnetic radiation impinges on a material containing a photoactive component to induce a physical or chemical change in that material. A useful or latent image is thereby produced which can be processed into a useful image for semiconductor device fabrication.

Although the polymer product itself may be photoactive, generally a photosensitive composition contains one or more photoactive components in addition to the polymer product. Upon exposure to electromagnetic radiation (e.g., UV light), the photoactive component acts to change the rheological state, solubility, surface characteristics, refractive index, color, electromagnetic characteristics or other such physical or chemical characteristics of the photosensitive composition as described in the Thompson et al. publication supra.

For imaging very fine features at the submicron level in semiconductor devices, electromagnetic radiation in the far or extreme ultraviolet (UV) is needed. Positive working resists generally are utilized for semiconductor manufacture. Lithography in the UV at 365 nm (I-line) using novolak polymers and diazonaphthoquinones as dissolution inhibitors is a currently established chip technology having a resolution limit of about 0.35–0.30 micron. Lithography in the far UV at 248 nm using p-hydroxystyrene polymers is known and has a resolution limit of 0.35–0.18 nm. There is strong impetus for future photolithography at even shorter wavelengths, due to a decreasing lower resolution limit with decreasing wavelength (i.e., a resolution limit of 0.18–0.12 micron for 193 nm imaging). Photolithography using 193 nm exposure wavelength (obtained from an argon fluorine (ArF) excimer laser) is a leading candidate for future microelectronics fabrication using 0.18 and 0.13 $\mu$m design rules. Photolithography using 157 nm exposure wavelength (obtained using an $F_2$ laser source) may be used for future microelectronics fabrication using 0.100 $\mu$m or less design rules. The opacity of traditional near UV and far UV organic photoresists at 193 nm and shorter wavelengths precludes their use in single-layer schemes at these wavelengths.

Some resist compositions suitable for imaging at 193 nm are known. For example, photoresist compositions comprising cycloolefinmaleic anhydride alternating copolymers have been shown to be useful for imaging of semiconductors at 193 nm (see F. M. Houlihan et al, *Macromolecules*, 30, pages 6517–6534 (1997); T. Wallow et al., *SPIE*, Vol. 2724, pages 355–364; and F. M. Houlihan et al., *Journal of Photopolymer Science and Technology*, 10, No. 3, pages 511–520 (1997)). Several publications are focused on 193 nm resists (i.e., U. Okoroanyanwu et al, *SPIE*, Vol. 3049, pages 92–103; R. Allen et al., *SPIE*, Vol. 2724, pages 334–343; and *Semiconductor International*, September 1997, pages 74–80). Compositions comprising addition polymers and/or ROMP (ring-opening methathesis polymerization) of functionalized norbornenes have been disclosed (e.g., PCT WO 97/33198 (Sep. 12, 1997) to B. F. Goodrich). Homopolymers and maleic anhydride copolymers of norbornadiene and their use in 193 nm lithography have been disclosed (J. Niu and J. Frechet, Angew. *Chem. Int. Ed.*, 37, No. 5, (1998), pages 667–670). No resist compositions for imaging at 157 nm have been disclosed.

Copolymers of fluoroolefin monomers and cyclic unsaturated monomers have been described in U.S. Pat. Nos. 5,177,166 and 5,229,473. These patents do not disclose the use of these copolymers in any photosensitive compositions. Copolymers of certain fluorinated olefins with certain vinyl esters and vinyl ethers have been described. For example, the copolymer of TFE with cyclohexanecarboxylate, vinyl ester is described in Japanese Patent Appl. JP 03281604 and the copolymer of TFE and cyclohexyl vinyl ether is described in Japanese Patent Appl. JP 54046286. Copolymers of TFE and vinyl esters, such as vinyl acetate, and use of these copolymers in photosensitive compositions for refractive index imaging (e.g. holography) is described in U.S. Pat. No. 4,963,471. Disclosures relating to copolymers comprising fluorinated olefins and vinyl esters of formula $CH_2$=$CHO_2CR$ and vinyl ethers of formulae $CH_2$=$CHOCH_2R$ or $CH_2$=$CHOR$, have R groups with a C:H ratio that is relatively low and which is less than 0.58.

Homopolymers and copolymers of certain monomers that possess properties of being both cyclic and fluorine-containing have been described as well as their application as components in photodefinable fluorine-containing polymer films in Japanese Kokai No Hei 9(1997)-43856. There is no teaching in this reference of homopolymers or copolymers comprised of polycyclic comonomers as photoresist components. Furthermore, there is no teaching that the compositions disclosed could be used in photoresists with imaging effected at far UV wavelengths of less than 180 nm.

U.S. Pat. No. 5,655,627 discloses a process for generating a negative tone resist image by coating a silicon wafer with a copolymer resist solution of pentafluoropropyl methacrylate-t-butyl methacrylate in a solvent, and then exposing at 193 nm and developing with a carbon dioxide critical fluid.

There is a critical need though for other novel resist compositions for use at 193 nm or lower, and particularly at 157 nm, that have not only high transparency at these short wavelengths but also other suitable key properties, including good plasma etch resistance and adhesive properties.

SUMMARY OF THE INVENTION

The present photoresist in some embodiments comprises:
(a) a fluorine-containing copolymer comprising a repeat unit derived from at least one ethylenically unsaturated compound characterized in that at least one ethylenically unsaturated compound is polycyclic and at least one ethylenically unsaturated compound contains at least one fluorine atom covalently attached to an ethylenically unsaturated carbon atom; and (b) at least one photoactive component; wherein the fluorine-containing copolymer does not contain aromatic functionality but contains sufficient functionality to render the photoresist developable so as to produce a relief image, upon imagewise exposure to ultraviolet radiation having wavelength of $\leq 365$ nm.

In one preferred embodiment, at least one ethylenically unsaturated compound is selected from the group consisting of:

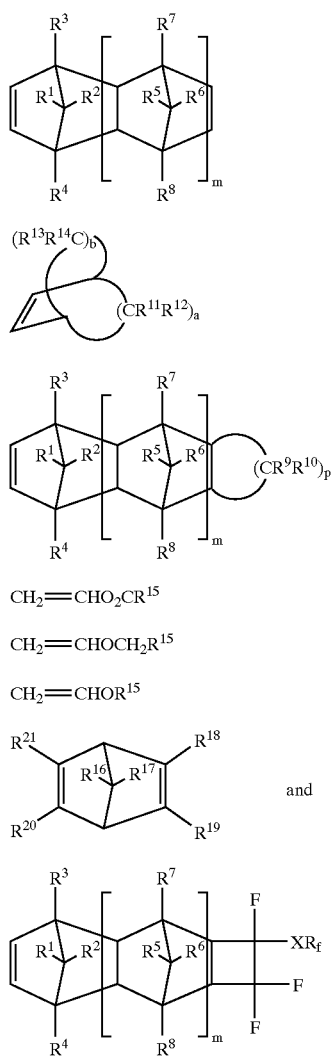

(H)

(I)

(J)

(K) $CH_2=CHO_2CR^{15}$ (L) $CH_2=CHOCH_2R^{15}$ (M) $CH_2=CHOR^{15}$ (N)

and (O)

wherein:
each of m and n is 0, 1 or 2, p is an integer of at least 3;
a and b are independently 1 to 3 except that a is not=1 when b=2 or vice versa;
$R^1$ to $R^{14}$ are the same or different and each represents a hydrogen atom, a halogen atom which can be any element of the halogen group but, typically, chlorine, fluorine or bromine, a carboxyl group, a hydrocarbon group of 1 to about 20 carbon atoms or a heteroatom substituted hydrocarbon group of 1 to 20 carbon atoms having one or more heteroatoms which can be oxygen, nitrogen or sulfur;
$R^{15}$ is a saturated alkyl group of about 4 to 20 carbon atoms, optionally containing one or more ether oxygen atoms with the proviso that the ratio of carbon atoms to hydrogen atoms is greater than or equal to 0.58;

$R^{16}$ to $R^{21}$ are each independently hydrogen atoms, $C_1$ to $C_{12}$ alkyls, $(CH_2)_qCO_2A$, $CO_2(CH_2)_qCO_2A$ or $CO_2A$ wherein q is 1 to 12 and A is hydrogen or an acid protecting group with the proviso that at least one of $R^{18}$ to $R^{21}$ is $CO_2A$;
X is oxygen or a direct bond;
$R_f$ is a straight chain or branched perfluoroalkyl group of from 1 to 10 carbon atoms, optionally substituted by ether oxygen atoms. The perfluoroalkyl group may be selected from the group consisting of $CF_3$, $C_2F_5$, and $C_3F_7$.

In a separate embodiment the invention comprises a photoresist comprising:

(a) a fluorine-containing copolymer comprising a repeat unit derived from a comonomer having the structure:

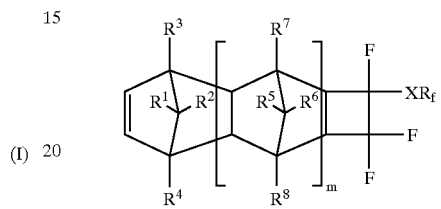

wherein m is 0, 1 or 2;
$R^1$ to $R^8$ are the same or different and each represents a hydrogen atom, a halogen atom which can be any element of the halogen group but, typically, chlorine, fluorine or bromine, a carboxyl group, a hydrocarbon group of 1 to about 20 carbon atoms or a heteroatom substituted hydrocarbon group of 1 to 20 carbon atoms having one or more heteroatoms which can be oxygen, nitrogen or sulfur;
X is oxygen or a direct bond;
$R_f$ is a straight chain or branched perfluoroalkyl group of from 1 to 10 carbon atoms; and (b) a photoactive component,
wherein the fluorine-containing copolymer contains sufficient functionality to render the photoresist developable so as to produce relief images, upon imagewise exposure to ultraviolet radiation having a wavelength of $\leq 365$ nm. In this photoresist, the fluorine-containing copolymer may further comprises a repeat unit derived from at least one ethylenically unsaturated compound containing at least one fluorine atom covalently attached to an ethylenically unsaturated carbon atom.

The present photoresist in other embodiments comprises
(a) a fluorine-containing copolymer comprising a repeat unit derived from at least one polycyclic ethylenically unsaturated compound having at least one atom or group selected from the group consisting of fluorine atom, perfluoroalkyl group, and perfluoroalkoxy group, characterized in that the at least one atom or group is covalently attached to a carbon atom which is contained within a ring structure and separated from each ethylenically unsaturated carbon atom of the ethylenically unsaturated compound by at least one covalently attached carbon atom; that is, the fluorine atom is not on the polymerizable carbon-carbon double bond itself or a carbon atom next to that double bond the fluorine atom is bonded to a saturated carbon which saturated carbon atom is separated from that unsaturated carbon atom by at least one saturated carbon atom; and (b) at least one photoactive component;
wherein the fluorine-containing copolymer does not contain aromatic functionality but contains sufficient functionality to render the photoresist developable so as to produce a relief image, upon imagewise exposure to ultraviolet radiation having wavelength of $\leq 365$ nm.

In another embodiment, the invention is a process for preparing a photoresist image on a substrate comprising, in order:
(W) applying a photoresist composition on a substrate, wherein the photoresist composition comprises:
  (a) a fluorine-containing copolymer comprising a repeat unit derived from at least one ethylenically unsaturated compound characterized in that at least one ethylenically unsaturated compound is polycyclic and at least one ethylenically unsaturated compound contains at least one fluorine atom covalently attached to an ethylenically unsaturated carbon atom, wherein the fluorine-containing copolymer contains sufficient functionality to render the photoresist developable so as to produce a relief image, upon imagewise exposure to ultraviolet radiation having wavelength of ≦365 nm;
  (b) at least one photoactive component; and
  (c) a solvent;
(X) drying the the coated photoresist composition to substantially remove the solvent and thereby to form a photoresist layer on the substrate;
(Y) imagewise exposing the photoresist layer to form imaged and non-imaged areas; and
(Z) developing the exposed photoresist layer having imaged and non-imaged areas to form the relief image on the substate.

In another embodiment, the invention is a process for preparing a photoresist image on a substrate comprising, in order:
(W) applying a photoresist composition on a substrate, wherein the photoresist composition comprises:
  (a) a fluorine-containing copolymer comprising a repeat unit derived from at least one polycyclic ethylenically unsaturated compound having at least one atom or group selected from the group consisting of fluorine atom, perfluoroalkyl group, and perfluoroalkoxy group, characterized in that the at least one atom or group is covalently attached to a carbon atom which is contained within a ring structure and separated from each ethylenically unsaturated carbon atom of the ethylenically unsaturated compound by at least one covalently attached carbon atom, wherein the fluorine-containing copolymer does not contain aromatic functionality but contains sufficient functionality to render the photoresist developable so as to produce a relief image, upon imagewise exposure to ultraviolet radiation having wavelength of <365 nm;
  (b) at least one photoactive component; and
  (c) a solvent;
(X) drying the coated photoresist composition to substantially remove the solvent and thereby to form a photoresist layer on the substrate;
(Y) imagewise exposing the photoresist layer to form imaged and non-imaged areas; and
(Z) developing the exposed photoresist layer having imaged and non-imaged areas to form the relief image on the substrate.

The developing step (Z) in the above processes can either be negative-working or positive-working.

In another embodiment, the invention is a fluorine-containing copolymer comprising:
(i) a repeat unit derived from at least one ethylenically unsaturated compound containing at least one fluorine atom covalently attached to an ethylenically unsaturated carbon atom; and
(ii) a repeat unit derived from the group consisting of $CH_2=CHO_2CR^{15}$, $CH_2=CHOCH_2R^{15}$ and $CH_2=CHOR^{15}$, wherein $R^{15}$ is a saturated alkyl group of about 4 to 20 carbon atoms, optionally containing one or more ether oxygens with the proviso that the ratio of carbon atoms to hydrogen atoms is greater than or equal to 0.58.

In still another embodiment, the invention is a fluorine-containing copolymer comprising:
(i) a repeat unit derived from at least one ethylenically unsaturated compound containing at least one fluorine atom covalently attached to an ethylenically unsaturated carbon atom; and
(ii) a repeat unit derived from a comonomer having the structure:

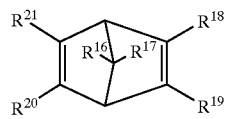

wherein $R^{16}$ to $R^{21}$ are each independently hydrogen atoms, $C_1$ to $C_{12}$ alkyls, $(CH_2)_q CO_2A$, $CO_2(CH_2)_q CO_2A$ or $CO_2A$ wherein q is 1 to 12 and A is hydrogen or an acid protecting group with the proviso that at least one of $R^{18}$ to $R^{21}$ is $CO_2A$.

In still another embodiment, the invention is a fluorine-containing copolymer comprising:
(i) a repeat unit derived from at least one ethylenically unsaturated compound containing at least one fluorine atom covalently attached to an ethylenically unsaturated carbon atom; and
(ii) a repeat unit derived from a comonomer having the structure:

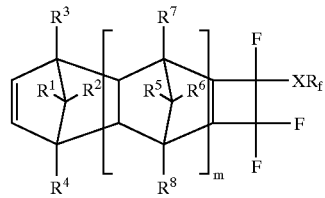

wherein m is 0, 1 or 2;
$R^1$ to $R^8$ are the same or different and each represents a hydrogen atom, a halogen atom which can be any element of the halogen group but, typically, chlorine, fluorine or bromine, a carboxyl group, a hydrocarbon group of 1 to about 20 carbon atoms or a heteroatom substituted hydrocarbon group of 1 to 20 carbon atoms having one or more heteroatoms which can be oxygen, nitrogen or sulfur;
X is oxygen or a direct bond;
$R_f$ is a straight chain or branched perfluoroalkyl group of from 1 to 10 carbon atoms, optionally substituted by ether oxygens.

A key characteristic of the copolymers (and photoresists comprised of the copolymers) of this invention is the cooperative combination of polycyclic repeat unit(s) with the same or different repeat units that are fluorine containing and, furthermore, with all repeat units in the copolymers not containing aromatic functionality. The presence of polycyclic repeat units in the copolymers is critical in order for the copolymers to possess high resistance to plasma etching (e.g., reactive ion etching). Polycyclic repeat units also tend to provide a high glass transition temperature which is critical for maintaining dimensional stability in the resist films. The presence of repeat units that are fluorine-containing is critical in order for the copolymers to possess high optical transparency, i.e., to have low optical absorptions in the extreme and far UV. The absence of aromatic functionality in the repeat units of the copolymers is also required in order for the polymers to possess high optical transparency.

In certain embodiments of this invention, the fluorine-containing copolymer may be comprised of a repeat unit derived from at least one polycyclic ethylenically unsaturated compound having at least one atom or group selected from the group consisting of fluorine atom, perfluoroalkyl group, and perfluoroalkoxy group, covalently attached to a carbon atom which is contained within a ring structure. Fluorine atoms, perfluoroalkyl groups and perfluoroalkoxy groups tend to inhibit polymerization of cyclic ethylenically unsaturated compounds by metal-catalyzed addition polymerization or metathesis polymerization when such groups are attached directly to an ethylenically unsaturated carbon atom. Thus, it is critical in such cases that the at least one fluorine atom, perfluoroalkyl group and perfluoroalkoxy group be separated from each ethylenically unsaturated carbon atom of the ethylenically unsaturated compound by at least one covalently attached carbon atom. Furthermore, attaching the atom and/or group directly to a ring minimizes the presence of undesirable non-fluorinated aliphatic carbon atoms.

The copolymers of this invention surprisingly have balanced properties that are critical for imparting necessary properties to photoresist compositions for semiconductor applications. First, these copolymers have unexpectedly low optical absorptions in the extreme and far UV, including 193 nm and 157 nm wavelengths. Having copolymers with low optical absorptions is critical for formulating high photospeed resists wherein the major amount of UV light is absorbed by the photoactive component(s) and not lost due to absorption by the copolymer (matrix of the resist). Second, resists comprising the fluorine-containing polymers of this invention desirably exhibit very low plasma etch rates. This latter property is critical in affording high resolution precision resists that are required in semiconductor fabrication. Achieving simultaneously suitable values of these properties is particularly critical for imaging at 157 nm. In this case, ultra thin resists are needed for high resolution, but these thin resists must nevertheless be highly etch resistant such that resist remains on imaged substrates and protects areas of underlying substrate during etching.

The photoresist compositions of this invention have a particularly good balance of desirable properties, including high transparency to extreme, far, and near ultraviolet light, high plasma etch resistance, and projected high resolution characteristics suitable for microelectronics device fabrication using 0.18 and 0.13 μm design rules. The photoresist compositions of this invention in particular have good optical transparency at 157 nm. The novel copolymers of this invention also have good properties including anticipated high transparency at 157 nm and other wavelengths in the UV.

DETAILED DESCRIPTION OF THE PREFERRED EMBODIMENT(S)

The present invention is a photoresist for microlithography comprising a fluorine-containing copolymer and at least one photoactive component, wherein the fluorine-containing copolymer contains sufficient functionality to render the photoresist developable so as to produce a relief image, following imagewise exposure to ultraviolet radiation having wavelength of $\leq 365$ nm. In some preferred embodiments, the sufficient functionality is selected from an acid (e.g., a carboxylic acid) and/or an acid protected group to render the exposed portions of photoresist soluble in basic solution upon exposure to sufficient ultraviolet radiation having wavelength of $\leq 365$ nm while the unexposed portions are insoluble in the basic solution. In this manner a relief image can be created using the photoresist. The present photoresists are useful for 365 nm (I-line), 248 nm (KrF laser), and especially 193 nm (ArF laser) and 157 nm (F2 laser) microlithography. These photoresists are critical in allowing for the imaging of feature sizes in the sub-01.0 micrometer range.

In the preferred embodiments of this invention, the photoresist composition comprises copolymers that comprise a repeat unit derived from at least one polycyclic comonomer (i.e., a comonomer comprising at least two rings, e.g., norbornene). This is important for three main reasons: 1) polycyclic monomers have relatively high carbon to hydrogen ratios (C:H), which results in base polymers comprised of repeat units of these polycyclic monomers generally having good plasma etch resistance; 2) polymers having repeat units derived from polyclic monomers, which preferably can be fully saturated upon polymerization, generally have good transparency characteristics; and 3) polymers prepared from polycyclic monomers usually have relatively high glass transition temperatures for improved dimensional stability during processing. The ethylenically unsaturated group may be contained within the polycyclic moiety as in norbornene or may be pendant to the polycyclic moiety as in 1-adamantane carboxylate vinyl ester. A polymer comprised of repeat units derived from polycyclic comonomers, having high C:H ratios, has a relatively low Ohnishi number (O.N.), where:

$$O.N. = N/(N_C - N_O)$$

with N being the number of atoms in the repeat unit of the polymer, $N_C$ being the number of carbon atoms in the repeat unit of the polymer, and $N_O$ being the number of oxygen atoms in the repeat unit of the polymer. There is an empirical law discovered by Ohnishi et al. (*J. Electrochem. Soc., Solid-State Sci. Technol.*, 130,143 (1983) which states that the reactive ion etch (RIE) rate of polymers is a linear function of the Ohnishi number (O.N.). As one example, poly(norbornene) has formula $(C_7H_{10})_n$ and the O.N.=17/7=2.42. Polymers comprised predominantly of carbon and hydrogen having polycyclic moieties and relatively little functionality containing oxygen will have relatively low O.N.s and will, according to the empirical law of Ohnishi, have corresponding low (in an approximate linear manner) RIE rates.

As is well known to those skilled in the polymer art, an ethylenically unsaturated compound undergoes free radical polymerization to afford a polymer having a repeat unit that is derived from the ethylenically unsaturated compound. Specifically, an ethylenically unsaturated compound having structure:

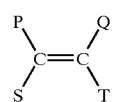

that undergoes free radical polymerization will afford a polymer having a repeat unit:

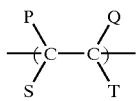

where P, Q, S, and T independently can represent, but are not limited to, H, F, Cl, Br, alkyl, aryl, aralkyl and cycloalkyl.

If only one ethylenically unsaturated compound undergoes polymerization, the resulting polymer is a homopolymer. If two or more distinct ethylenically unsaturated compounds undergo polymerization, the resulting polymer is a copolymer.

Some representative examples of ethylenically unsaturated compounds and their corresponding repeat units are given below:

 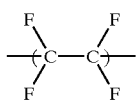 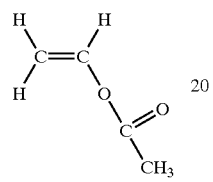

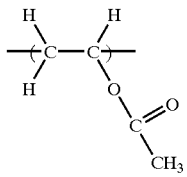

In the sections that follow, the photoresist compositions of this invention are described in terms of their component parts.

Fluorine-Containing Copolymer

The photoresists of this invention comprise a fluorine-containing copolymer comprising a repeat unit derived from at least one ethylenically unsaturated compound which is polycyclic and at least one ethylenically unsaturated compound contains at least one fluorine atom covalently attached to an ethylenically unsaturated carbon atom. Representative ethylenically unsaturated compounds that are suitable for the fluorine-containing copolymers of this invention include, but are not limited to, tetrafluoroethylene, chlorotrifluoroethylene, hexafluoropropylene, trifluoroethylene, vinylidene fluoride, vinyl fluoride, perfluoro-(2,2-dimethyl-1,3-dioxole), perfluoro-(2-methylene-4-methyl-1,3-dioxolane, $CF_2$=$CFO(CF_2)_tCF$=$CF_2$, where t is 1 or 2, and $R_fOCF$=$CF_2$ wherein $R_f$ is a saturated fluoroalkyl group of from 1 to about 10 carbon atoms. The fluorine-containing copolymers of this invention can be comprised of any integral number of additional fluorine-containing comonomers, which include, but are not limited to, those listed supra. Preferred comonomers are tetrafluoroethylene, chlorotrifluoroethylene, hexafluoropropylene, trifluoroethylene and $R_fOCF$=$CF_2$, wherein $R_f$ is a saturated fluoroalkyl group of from 1 to about 10 carbon atoms. More preferred comonomers are tetrafluoroethylene, chlorotrifluoroethylene, hexafluoropropylene, and $R_fOCF$=$CF_2$, wherein $R_f$ is a saturated perfluoroalkyl group of from 1 to about 10 carbon atoms. Most preferred comonomers are tetrafluoroethylene and chlorotrifluoroethylene.

In some preferred embodiments, the fluorine-containing copolymer of the photoresists of this invention further comprises a repeat unit derived from at least one unsaturated compound selected from the group of structures H—O:

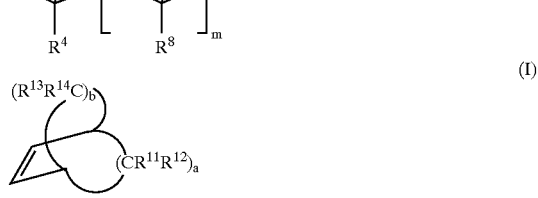

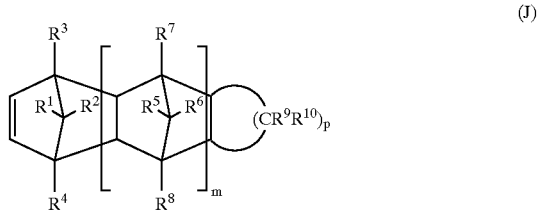

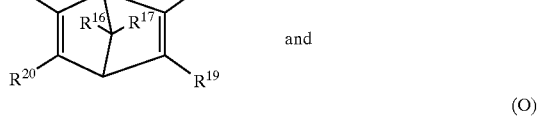

wherein:
each of m and n is 0, 1 or 2, p is an integer of at least 3; a and b are independently 1 to 3 except that a is not=1 when b=2 or vice versa;

$R^1$ to $R^{14}$ are the same or different and each represents a hydrogen atom, a halogen atom which can be any element of the halogen group but, typically, chlorine, fluorine or bromine, a carboxyl group, a hydrocarbon group of 1 to about 20 carbon atoms or a heteroatom substituted hydrocarbon group of 1 to 20 carbon atoms having one or more heteroatoms which can be oxygen, nitrogen or sulfur. More specifically, the hydrocarbon groups can be straight chain or branched chain, paraffinic or olefinic, alicyclic or aromatic. Suitable heteroatoms include oxygen, nitrogen or sulfur. An example of a hydrocarbon group containing oxygen as a heteroatom is an alkyl carboxylate containing about 1 to about 20 carbon atoms, more specifically a secondary or tertiary alkyl carboxylate containing about 2 to 14 carbon atoms or an alkoxy group containing from 1 to about 20 carbon atoms.

$R^{15}$ is a saturated alkyl group of about 4 to 20 carbon atoms, optionally containing one or more ether oxygens with the proviso that the ratio of carbon atoms to hydrogen atoms is greater than or equal to 0.58.

$R^{16}$ to $R^{21}$ are each independently hydrogen atoms, $C_1$ to $C_{12}$ alkyls, $(CH_2)_qCO_2A$, $CO_2(CH_2)_qCO_2A$ or $CO_2A$ wherein q is 1 to 12 and A is hydrogen or an acid protected group with the proviso that at least one of $R^{18}$ to $R^{21}$ is $CO_2A$.

X is oxygen or a direct bond.

$R_f$ is a straight chain or branched chain perfluoroalkyl group of from 1 to 10 carbon atoms, optionally substituted by at least on ether oxygen atom. The perfluoroalkyl group can be $CF_3$, $C_2F_5$, or $C_3F_7$.

Structures H—O above represent additional possible comonomers of the fluorine-containing polymers in the photoresists of this invention.

Representative comonomers having structure H include, but are not limited to:

 (norbornene), 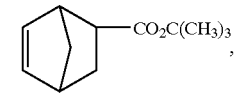

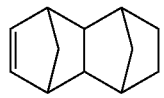, 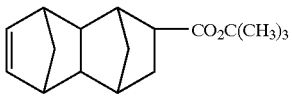

Representative comonomers having structure I include, but are not limited to:

 (bicyclo[2.2.2]oct-2-ene, 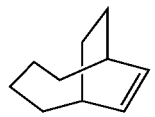

Representative comonomers having structure J include, but are not limited to:

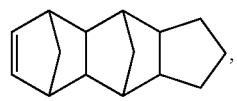, 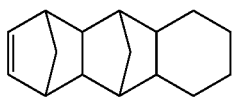

Representative comonomers having structure K include, but are not limited to:

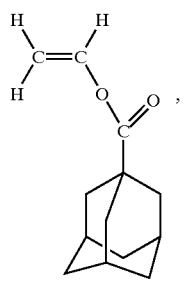, 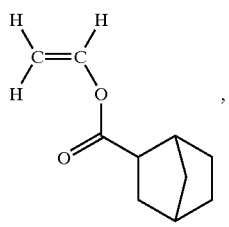,

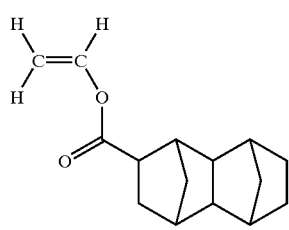

Representative comonomers having structure L include, but are not limited to:

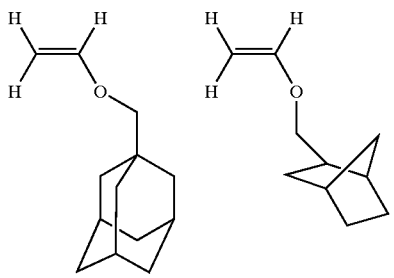

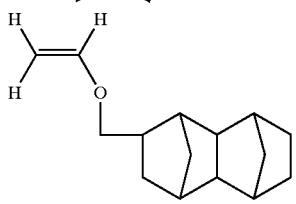

Representative comonomers having structure M include, but are not limited to:

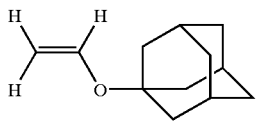 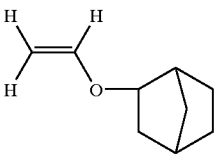

All of the inventive copolymers comprising comonomers having structures K, L and M are characterized in being copolymers comprising fluorinated olefins and vinyl esters of formula $CH_2=CHO_2CR$ or vinyl ethers of formulae $CH_2=CHOCH_2R$ or $CH_2=CHOR$, having R groups with a C:H ratio that is relatively high and which is greater than 0.58 since a high C:H ratio corresponds to good plasma etch resistance. (To distinguish them from copolymers comprising fluorinated olefins and vinyl esters of formula $CH_2=CHO_2CR$ or vinyl ethers of formulae $CH_2=CHOCH_2R$ or $CH_2=CHOR$, have R groups with a C:H ratio that is relatively low and which is less than 0.58.

Representative comonomers having structure N include, but are not limited to:

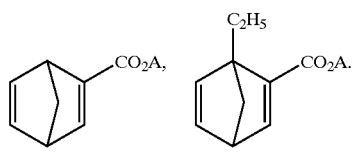

where A=H, $(CH_3)_3C$, $(CH_3)_3Si$.

Representative comonomers having structure O, include but are not limited to:

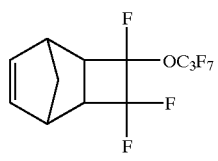 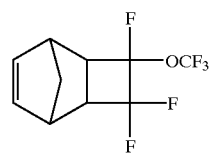

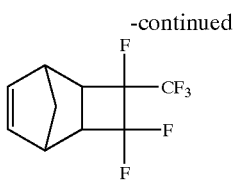

Such comonomers may be conveniently prepared by cycloaddition of norbornadiene with perfluoropropylvinyl ether, perfluoromethylvinyl ether or hexafluoropropylene, respectively.

In preferred embodiments described above having at least one unsaturated compound of structure H—O as the second recited comonomer, there is a limitation on the second comonomer if (and only if) the fluorine-containing copolymer is not comprised of additional comonomer(s) having functionality that is selected from a carboxylic acid and a protected acid group. In this case, the fluorine-containing copolymer has just two comonomers (the two recited comonomers and having no additional unrecited comonomers). In this case, there must be sufficient functionality that is selected from a carboxylic acid and a protected acid group present in the at least one unsaturated compound (i.e., the second recited comonomer) such that the photoresists of this invention that are comprised of the fluorine-containing polymer are developable upon imagewise exposure as explained in more detail infra. In these embodiments with the fluorine-containing copolymer having just two comonomers, the mole percentages of the two comonomers in the copolymer can range from 90%, 10% to 10%, 90% for the fluoromonomer (first recited monomer) and the second comonomer, respectively. Preferably, the mole percentages of the two comonomers are in the range from 60%, 40% to 40%, 60% for the fluoromonomer (first recited monomer) and the second comonomer, respectively.

The fluorine-containing copolymers comprising the photoresists of this invention can be comprised of any integral number without limit of additional comonomers beyond the two recited comonomers (i.e., (i) at least one ethylenically unsaturated compound containing at least one fluorine atom covalently attached to an ethylenically unsaturated carbon atom; and (ii) at least one unsaturated compound selected from the group of structures H—N) for some embodiments. Representative additional comonomers can include, but are not limited to, acrylic acid, methacrylic acid, t-butyl acrylate, t-butyl methacrylate, t-amyl acrylate, t-amyl methacrylate, isobutyl acrylate, isobutyl methacrylate, ethylene, vinyl acetate, itaconic acid, and vinyl alcohol. In those embodiments where the fluorine-containing copolymer has two recited comonomers and is comprised of three or more comonomers, the mole percentage of the second recited comonomer (i.e., (ii) at least one unsaturated compound selected from the group of structures H—N) ranges from about 20 mole % to about 80 mole %, preferably ranges from about 30 mole % to about 70 mole %, more preferably ranges from about 40 mole % to about 70 mole %, and still most preferably is about 50 to about 70 mole %. Summation of the mole percentages of all other comonomers constituting the copolymer represents a balance that when added to the mole percentage of the second recited comonomer totals 100%. The sum of the mole percentages of all other comonomers present in the copolymer except for the second recited comonomer broadly is in the range from about 80 mole % to about 20 mole %. Preferably, the sum of the mole percentages of all other comonomers is in the range from about 70 mole % to about 30 mole %. More preferably, the sum of the mole percentages of all other comonomers is in the range from about 60 mole % to about 30 mole %, and, still more preferably, the sum of the mole percentages of all other comonomers is in the range from about 50 mole % to about 30 mole %. When the fluorine-containing polymer is a terpolymer, a suitable ratio of the fluoromonomer (first recited monomer) to the additional comonomer can broadly range from 5:95 to 95:5. When the fluorine-containing copolymer contains additional comonomers having functionality of acid groups or protected acid groups in sufficient amounts necessary for developability, the functionality can be present or absent in the second recited comonomer without limitation.

A given fluorine-containing copolymer, comprised of a repeat unit derived from a comonomer having at least one fluorine atom attached to an ethylenically unsaturated carbon atom, of the photoresist composition(s) of this invention can be prepared by free radical polymerization. Polymers may be prepared by bulk, solution, suspension or emulsion polymerization techniques known to those skilled in the art using free radical initiators, such as azo compounds or peroxides.

A given fluorine-containing copolymer, containing only repeat units derived from all cyclic comonomers and totally lacking a repeat unit derived from a comonomer that has one or more fluorine atom(s) attached to an ethylenically unsaturated carbon atom(s), of the photoresist composition(s) of this invention can also be prepared by free radical polymerization, but in addition can be prepared by other polymerization methods, including vinyl-addition polymerization and ring-opening methathesis polymerization (ROMP). Both of the latter polymerization methods are known to those skilled in the art. Vinyl-addition polymerization using nickel and palladium catalysts is disclosed in the following references: 1) Okoroanyanwu U.; Shimokawa, T.; Byers, J. D.; Willson, C. G. *J. Mol. Catal.* A: Chemical 1998, 133, 93; 2) PCT WO 97/33198 (Sep. 12, 1997) assigned to B. F. Goodrich; 3) Reinmuth, A.; Mathew, J. P.; Melia, J.; Risse, W. *Macromol. Rapid Commun.* 1996, 17, 173; and 4) Breunig, S.; Risse, W. *Makromol. Chem.* 1992, 193, 2915. Ring-opening metathesis polymerization is disclosed in references 1) and 2) supra using ruthenium and irridium catalysts; and also in 5) Schwab, P.; Grubbs, R. H.; Ziller, J. W. *J. Am. Chem. Soc.* 1996, 118, 100; and 6) Schwab, P.; France, M. B.; Ziller, J. W.; Grubbs, R. H. Angew. *Chem. Int. Ed. Engl.* 1995, 34, 2039.

Some of the fluorine-containing bipolymers of the resist compositions of this invention, where the bipolymer contains a fluoromonomer (e.g., TFE) and a cyclic olefin (e.g., norbornene) appear to be alternating or approximately alternating bipolymers having a structure, but not limited to, the one shown below:

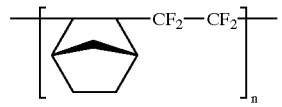

In such cases, the invention includes these alternating or approximately alternating copolymers but is not in any manner limited to just alternating copolymer structures.

Photoactive Component (PAC)

The compositions of this invention contain at least one photoactive component (PAC) that usually is a compound that affords either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG).

Suitable photoacid generators for this invention include, but are not limited to, 1) sulfonium salts (structure I), 2) iodonium salts (structure II), and 3) hydroxamic acid esters, such as structure III.

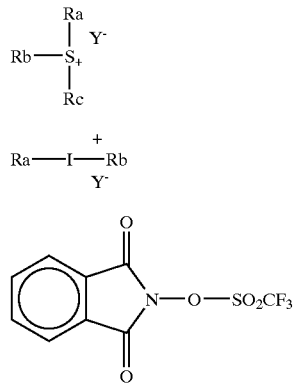

In structures I–II, $R_a$–$R_c$ are independently substituted or unsubstituted aryl or substituted or unsubstituted $C_1$–$C_{20}$ alkylaryl (aralkyl). Representative aryl groups include, but are not limited to, phenyl and naphthyl. Suitable substituents include, but are not limited to oxygen atom such that the substituent group can be hydroxyl (—OH) or $C_1$–$C_{20}$ alkyloxy (e.g., $C_{10}H_{21}O$). The anion Y— in structures I–II can be, but is not limited to, $SbF_6$— (hexafluoroantimonate), $CF_3SO_3$— (trifluoromethylsulfonate=triflate), and $C_4F_9SO_3$— (perfluorobutylsulfonate).

Protective Groups for Removal by PAC Catalysis

The fluorine-containing copolymers of the resist compositions of this invention may contain one or more components having protected acid groups that can yield, by catalysis of acids or bases generated photolytically from photoactive compounds (PACs), hydrophilic acid or base groups which enable development of resist coatings. A given protected acid group is one that is normally chosen on the basis of its being acid labile, such that when photoacid is produced upon imagewise exposure, the acid will catalyze deprotection and production of hydrophilic acid groups that are necessary for development under aqueous conditions. In addition, the fluorine-containing copolymers may also contain acid functionality that is not protected.

Examples of components having protected acid groups that yield a carboxylic acid as the hydrophilic group upon exposure to photogenerated acid include, but are not limited to, A) esters capable of forming, or rearranging to, a tertiary cation, B) esters of lactone, C) acetal esters, D) β-cyclic ketone esters, E) α-acyclic ether esters, and F) MEEMA (methoxy ethoxy ethyl methacrylate) and other esters which are easily hydrolyzable because of anchimeric assistance. Some specific examples in category A) are t-butyl ester, 2-methyl-2-adamantyl ester, and isobornyl ester. Some specific examples in category B) are γ-butyrolactone-3-yl, γ-butyrolactone-2-yl, mavalonic lactone, 3-methyl-γ-butyrolactone-3-yl, 3-tetrahydrofuranyl, and 3-oxocyclohexyl. Some specific examples in category C) are 2-tetrahydropyranyl, 2-tetrahydrofuranyl, and 2,3-propylenecarbonate-1-yl. Additional examples in category C) include various esters from addition of vinyl ethers, such as, for example, ethoxy ethyl vinyl ether, methoxy ethoxy ethyl vinyl ether, and acetoxy ethoxy ethyl vinyl ether.

Examples of components having protected acid groups that yield an alcohol as the hydrophilic group upon exposure to photogenerated acid or base include, but are not limited to, t-butoxycarbonyl (t-BOC), t-butyl ether, and 3-cyclohexenyl ether.

In this invention, often, but not always, the components having protected groups are repeat units having protected acid groups that have been incorporated in the base copolymer resins of the compositions (as discussed supra). Frequently the protected acid groups are present in one or more comonomer(s) that are polymerized to form a given copolymeric base resin of this invention. Alternatively, in this invention, a copolymeric base resin can be formed by copolymerization with an acid-containing comonomer and then subsequently acid functionality in the resulting acid-containing copolymer can be partially or wholly converted by appropriate means to derivatives having protected acid groups. As one specific example, a copolymer of TFE/NB/t-BA (copolymer of tetrafluoro-ethylene, norbornene, and t-butyl acrylate) is a copolymeric base resin within the scope of the invention having t-butyl ester groups as protected-acid groups.

Dissolution Inhibitors and Additives

Various dissolution inhibitors can be utilized in this invention. Ideally, dissolution inhibitors (DIs) for far and extreme UV resists (e.g., 193 nm resists) should be designed/chosen to satisfy multiple materials needs including dissolution inhibition, plasma etch resistance, and adhesion behavior of resist compositions comprising a given DI additive. Some dissolution inhibiting compounds also serve as plasticizers in resist compositions.

A variety of bile-salt esters (i.e., cholate esters) are particularly useful as DIs in the compositions of this invention. Bile-salt esters are known to be effective dissolution inhibitors for deep UV resists, beginning with work by Reichmanis et al. in 1983. (E. Reichmanis et al., "The Effect of Substituents on the Photosensitivity of 2-Nitrobenzyl Ester Deep UV Resists", *J. Electrochem. Soc.* 1983, 130, 1433–1437.) Bile-salt esters are particularly attractive choices as DIs for several reasons, including their availability from natural sources, their possessing a high alicyclic carbon content, and particularly for their being transparent in the deep and vacuum UV region, (which essentially is also the far and extreme UV region), of the electromagnetic spectrum (e.g., typically they are highly transparent at 193 nm). Furthermore, the bile-salt esters are also attractive DI choices since they may be designed to have widely ranging hydrophobic to hydrophilic compatibilities depending upon hydroxyl substitution and functionalization.

Representative bile-acids and bile-acid derivatives that are suitable as additives and/or dissolution inhibitors for this invention include, but are not limited to, those illustrated below, which are as follows: cholic acid (IV), deoxycholic acid (V), lithocholic acid (VI), t-butyl deoxycholate (VII), t-butyl lithocholate (VII), and t-butyl-3-α-acetyl lithocholate (IX). Bile-acid esters, including compounds VII–IX, are preferred dissolution inhibitors in this invention.

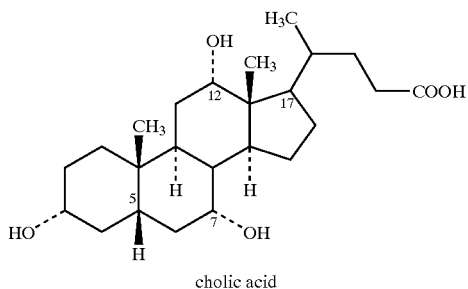

cholic acid

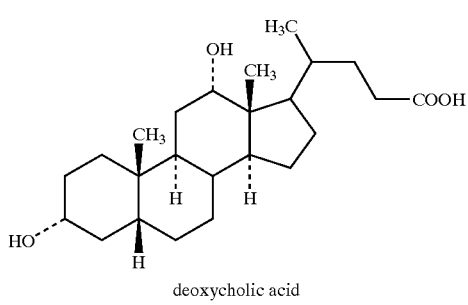

deoxycholic acid

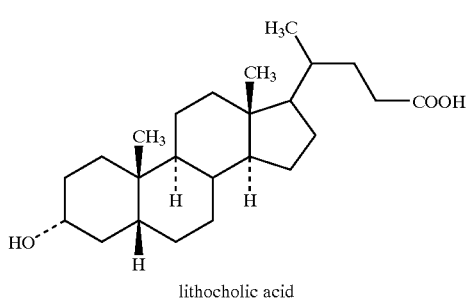

lithocholic acid

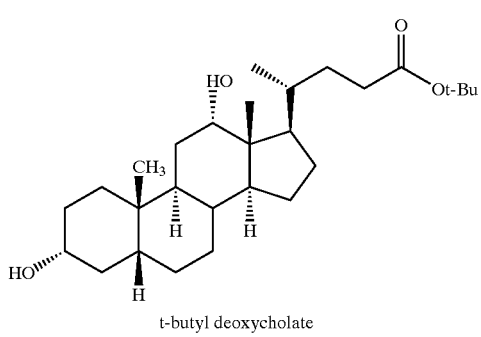

t-butyl deoxycholate

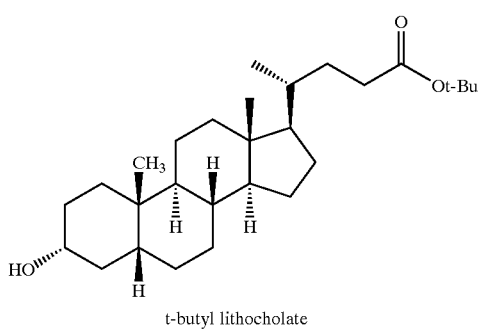

t-butyl lithocholate

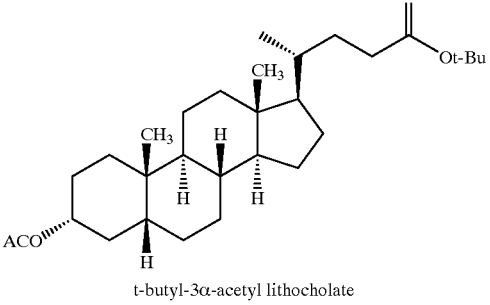

t-butyl-3α-acetyl lithocholate

The invention is not limited to use of bile-acid esters and related compounds as dissolution inhibitors. Other types of dissolution inhibitors, such as various diazonaphthoquinones (DNQs) and diazocoumarins(DCs), can be utilized in this invention in some applications. Diazanaphthoquinones and diazocoumarins are generally suitable in resists compositions designed for imaging at higher wavelengths of UV light (e.g., 365 nm and perhaps at 248 nm). These dissolution inhibitors are generally not preferred in resist compositions designed for imaging with UV light at 193 nm or lower wavelengths, since these compounds absorb strongly in this region of the UV and are usually not sufficiently transparent for most applications at these low UV wavelengths.

Components for Negative-Working Photoresist Embodiment

Some embodiments of this invention are negative-working photoresists. These negative-working photoresists comprise at least one binder polymer comprised of acid-labile groups and at least one photoactive component that affords photogenerated acid. Imagewise exposure of the resist affords photogenerated acid which converts the acid-labile groups to polar functionality (e.g., conversion of ester functionality (less polar) to acid functionality (more polar)). Development is then done in an organic solvent or critical fluid (having moderate to low polarity), which results in a negative-working system in which exposed areas remain and unexposed areas are removed.

A variety of different crosslinking agents can be employed as required or optional photoactive component(s) in the negative-working compositions of this invention. (A crosslinking agent is required in embodiments that involve insolubilization in developer solution as a result of crosslinking, but is optional in preferred embodiments that involve insolubilization in developer solution as a result of polar groups being formed in exposed areas that are insoluble in organic solvents and critical fluids having moderate/low polarity). Suitable crosslinking agents include, but are not limited to, various bis-azides, such as 4,4'-diazidodiphenyl sulfide and 3,3'-diazidodiphenyl sulfone. Preferably, a negative-working resist composition containing a crosslinking agent(s) also contains suitable functionality (e.g., unsaturated C=C bonds) that can react with the reactive species (e.g., nitrenes) that are generated upon exposure to UV to produce crosslinked polymers that are not soluble, dispersed, or substantially swollen in developer solution, which consequently imparts negative-working characteristics to the composition.

Solvents:

The photoresists of this invention may be formulated with a solvent such as chlorobenzene, methyl ethyl ketone, cyclohexanone or propylene glycol methyl ether acetate. A solvent can be chlorobenzene and methyl ethyl ketone or propylene glycol methyl ether acetate and cyclohexanone.

Other Components

The compositions of this invention can contain optional additional components. Examples of additional components which can be added include, but are not limited to, bases, surfactants, resolution enhancers, adhesion promoters, residue reducers, coating aids, plasticizers, and $T_g$ (glass transition temperature) modifiers. Some useful bases include tributylamine, tripentylamine, trihexylamine, triheptylamine, trioctylamine, benzimidazole, 4-phenylpyridine, 4,4'-diaminodiphenyl ether, nicotinamide, 1-piperidinoethanol, triethanolamine, 3-piperidino-1,2-propanediol, 2,2,6,6-tetramethylpiperidinol, tetrabutylammonium hydroxide, tetrabutylammonium acetate, and tetrabutylammonium lactate. Some useful surfactants include perfluorooctanoic acid ammonium salt, perfluorononanoic acid ammonium salt, ZONYL® (Trade name of DuPont) FSA, FSN, FSO, and FSK fluorosurfactants, polyoxyethylene stearylether, polyoxyethylene oleyl ether, polyoxyethylene octylphenyl ether, polyoxyethylene nonylphenyl ether, polyethylene glycol dilaurate, polyethylene glycol distearate, alkylbenzene sulphonates, sodium sulfosuccinate, and sodium lauryl sulfate.

Process Steps

Imagewise Exposure

The photoresist compositions of this invention are sensitive in the ultraviolet region of the electromagnetic spectrum and especially to those wavelengths ≦365 nm. Imagewise exposure of the resist compositions of this invention can be done at many different UV wavelengths including, but not limited to, 365 nm, 248 nm, 193 nm, 157 nm, and lower wavelengths. Imagewise exposure is preferably done with ultraviolet light of 248 nm, 193 nm, 157 nm, or lower wavelengths; is more preferably done with ultraviolet light of 193 nm, 157 nm, or lower wavelengths; and is still more preferably done with ultraviolet light of 157 nm or lower wavelengths. Imagewise exposure can either be done digitally with a laser or equivalent device or non-digitally with use of a photomask. Digital imaging with a laser is preferred. Suitable laser devices for digital imaging of the compositions of this invention include, but are not limited to, an argon-fluorine excimer laser with UV output at 193 nm, a krypton-fluorine excimer laser with UV output at 248 nm, and a fluorine (F2) laser with output at 157 nm. Since, as discussed supra, use of UV light of lower wavelength for imagewise exposure corresponds to higher resolution (lower resolution limit), the use of a lower wavelength (e.g., 193 nm or 157 nm or lower) is generally preferred over use of a higher wavelength (e.g., 248 nm or higher). Specifically, imaging at 157 nm is preferred over imaging at 193 nm for this reason.

Development

The fluorine-containing polymers in the resist compositions of this invention must contain sufficient functionality for development following imagewise exposure to UV light. Preferably, the functionality is acid or protected acid such that aqueous development is possible using a basic developer such as sodium hydroxide solution, potassium hydroxide solution, or ammonium hydroxide solution. Some preferred fluorine-containing polymers in the resist compositions of this invention are acid-containing copolymers or homopolymers comprised of at least one acid-containing monomer of structural unit:

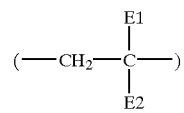

in which $E_1$ is H or $C_1$–$C_{12}$ alkyl; $E_2$ is $CO_2E_3$, $SO_3E$, or other acidic functional group; and E and $E_3$ are H or $C_1$–$C_{12}$ alkyl, which is unsubstituted or hydroxyl-substituted. Alkyl groups can contain one to twelve carbon atoms and preferably one to eight. A preferred acid-containing binder polymer for aqueous processability (aqueous development) in use is a carboxylic acid-containing copolymer. The level of carboxylic acid groups is determined for a given composition by optimizing the amount needed for good development in aqueous alkaline developer.

When an aqueous processable photoresist is coated or otherwise applied to a substrate and imagewise exposed to UV light, development of the photoresist composition may require that the binder material should contain sufficient acid groups (e.g., carboxylic acid groups) and/or protected acid groups that are at least partially deprotected upon exposure to render the photoresist (or other photoimageable coating composition) processable in aqueous alkaline developer. In case of a positive-working photoresist layer, the photoresist layer will be removed during development in portions which are exposed to UV radiation but will be substantially unaffected in unexposed portions during development by aqueous alkaline liquids such as wholly aqueous solutions containing 0.262 N tetramethylammonium hydroxide (with development at 25° C. usually for less than or equal to 120 seconds) or 1% sodium carbonate by weight (with development at a temperature of 30° C. usually for less than 2 or equal to 2 minutes). In case of a negative-working photoresist layer, the photoresist layer will be removed during development in portions which are unexposed to UV radiation but will be substantially unaffected in exposed portions during development using either a critical fluid or an organic solvent.

A critical fluid, as used herein, is one or more substances heated to a temperature near or above its critical temperature and compressed to a pressure near or above its critical pressure. Critical fluids in this invention are at least at a temperature that is higher than 15° C. below the critical temperature of the fluid and are at least at a pressure higher than 5 atmospheres below the critical pressure of the fluid. Carbon dioxide may be used for the critical fluid in the present invention. A comonomer having structure O particularly when $R_f$ is a longer chain fluoroalkyl group, more particularly $C_3F_7$, may be especially useful with supercritical carbon dioxide. Various organic solvents can also be used as developer in this invention. These include, but are not limited to, halogenated solvents and non-halogenated solvents. Halogenated solvents are preferred and fluorinated solvents are more preferred.

GLOSSARY

Chemicals/Monomers

| | |
|---|---|
| AA | Acrylic acid |
| | Aldrich Chemical Co., Milwaukee, WI |
| AdVE | 1-Adamantanemethylvinyl Ether |
| AIBN | 2,2'-azobisisobutyronitrile |
| | Aldrich Chemical Co., Milwaukee, WI |

-continued

GLOSSARY

| | |
|---|---|
| CFC-113 | 1,1,2-Trichlorotrifluoroethane (E. I. du Pont de Nemours and Company, Wilmington, DE) |
| MAA | Methacrylic acid Aldrich Chemical Co., Milwaukee, WI |
| MEK | 2-Butanone Aldrich Chemical Co., Milwaukee, WI |
| TFE | Tetrafluoroethylene (E. I. du Pont de Nemours and Company, Wilmington, DE) |
| NB | Norbornene = Bicyclo[2.2.1]hept-2-ene Aldrich Chemical Co., Milwaukee, WI |
| E | Ethylene |
| NB—$CO_2$H | 5-Norbornene-2-carboxylic acid = Bicyclo[2.2.1]hept-5-ene-2-carboxylic acid (Aldrich Chemical Co.) |
| NB—$CO_2^t$Bu | 5-Norbornene-2-carboxylic acid tert-butyl ester = tertiary-Butyl bicyclo[2.2.1]hept-5-ene-2-carboxylate |
| THF | Tetrahydrofuran Aldrich Chemical Co., Milwaukee, WI |
| Perkadox ® 16 N | Di-(4-tert-butylcyclohexyl)peroxydicarbonate Noury Chemical Corp., Burt, NY |
| TBA | Tertiary-Butyl acrylate |
| TCB | Trichlorobenzene Aldrich Chemical Co., Milwaukee, WI |
| VAc | Vinyl acetate Aldrich Chemical Co., Milwaukee, WI |
| VOH | Vinyl alcohol |
| Vazo ® 52 | 2,4-Dimethyl-2,2'-azobis(pentanenitrile) (E. I. du Pont de Nemours and Company, Wilmington, DE) |
| PGMEA | Propylene glycol methyl ether acetate Aldrich Chemical Co., Milwaukee, WI |
| General | |
| Extreme UV | Region of the electromagnetic spectrum in the ultraviolet that ranges from 10 nanometers to 200 nanometers |
| Far UV | Region of the electromagnetic spectrum in the ultraviolet that ranges from 200 nanometers to 300 nanometers |
| UV | Ultraviolet region of the electromagnetic spectrum which ranges from 10 nanometers to 390 nanometers |
| Near UV | Region of the electromagnetic spectrum in the ultraviolet that ranges from 300 nanometers to 390 nanometers |
| $M_n$ | Number-average molecular weight of a given polymer |
| $M_w$ | Weight-average molecular weight of a given polymer |
| $P = M_w/M_n$ | Polydispersity of a given polymer |
| Polymers | |
| P(TFE/NB) | Poly(tetrafluoroethylene-co-norbornene) = copolymer of tetrafluoroethylene and norbornene |
| P(TFE/NB—$CO_2$H) | Poly(tetrafluoroethylene-co-norbornene carboxylic acid) = copolymer of tetrafluoroethylene and norbornene carboxylic acid, where the $CO_2$H moiety can be substituted at any position of the NB—$CO_2$H comonomer of the polymer |
| P(TFE/NB/NB—$CO_2$H) | Poly(tetrafluoroethylene-co-norbornene-co-norbornene carboxylic acid) = copolymer of tetrafluoroethylene, norbornene, and norbornene carboxylic acid, where the $CO_2$H moiety can be substituted at any position of the NB—$CO_2$H comonomer of the polymer |
| P(TFE/NB/AA) | Poly(tetrafluoroethylene-co-norbornene-co-acrylic acid) |
| P(TFE/NB/E) | Poly(tetrafluoroethylene-co-norbornene-co-ethylene) |
| P(TFE/NB/MAA) | Poly(tetrafluoroethylene-co-norbornene-co-methacrylic acid) |
| P(TFE/NB/tBA) | Poly(tetrafluoroethylene-co-norbornene-co-t-butyl acrylate) |
| P(TFE/NB/tBA/AA) | Poly(tetrafluoroethylene-co-norbornene-co-t-butyl acrylate-co-acrylic acid) |
| P(TFE/NB/tBA/MAA) | Poly(tetrafluoroethylene-co-norbornene-co-t-butyl acrylate-co-methacrylic acid) |
| P(TFE/NB/VAc) | Poly(tetrafluoroethylene-co-norbornene-co-vinyl acetate) |
| P(TFE/NB/VOH) | Poly(tetrafluoroethylene-co-norbornene-co-vinyl alcohol) |
| P(TFE/NB/5-NB-2-$CO_2$tBu) | Poly(tetrafluoroethylene-co-norbornene-co-5-norbornene-2-carboxylic acid tert-butyl ester) |
| P(TFE/1-AdCO$_2$CH=CH$_2$) | Poly(tetrafluoroethylene-co-1-adamantane-carboxylate vinyl ester) |
| P(TFE/AdVE) | Poly(tetrafluoroethylene-co-1-adamantanemethylvinyl ether) |
| P(TFE/NBVether) | Poly(tetrafluoroethylene-co-2-norbornanemethylvinyl ether) |
| Structures | |

Perfluoro-(2,2-dimethyl-1,3-dioxole)

Perfluoro-(2-methylene-4-methyl-1,3-dioxolane)

EXAMPLES

Unless otherwise specified, all temperatures are in degrees Centigrade, all mass measurements are in grams, and all percentages are weight percentages.

Inherent viscosities were measured using a Cannon Auto-Visc II automated viscosity system (Cannon Instrument Company, State College, Pa. 16804) in the indicated solvents, generally at 35° C. and 1% concentration, and are reported in units of dL/g. Glass transition temperatures ($T_g$s) were determined by DSC (differential scanning calorimetry) using a heating rate of 20° C./min, data is reported from the second heat. The DSC unit used is a Model DSC2910 made by TA Instruments, Wilmington, Del.

Example 1

Synthesis of TFE/Norbornene Copolymer=P(TFE/NB)

A 1-L stirred Hastelloy autoclave was charged with a solution of 28.2 g (0.30 mol) norbornene in 300 mL CFC-113. The autoclave was closed, pressured to 200 psi with nitrogen three times, cooled and evacuated. TFE (35 g, 0.35 mol) was added and the mixture was heated with stirring to 40° C. A 25 mL portion of a solution of 5.0 g of 60% di(sec-butyl)peroxydicarbonate in 50 mL of CFC-113 was injected over 5 min. The resulting mixture was stirred for about 18 hr. The reactor was cooled, vented and the clear colorless solution was removed using CFC-113 to rinse. Polymer was isolated by precipitation of the CFC-113 solution into excess methanol. The white solid was filtered and dried in a vacuum oven overnight at about 45° C. Isolated yield was 7.4 g of white polymer; GPC (MEK) Mw 2800, Mn 1700, Mw/Mn 1.59; Inh. Visc. 0.0271 (MEK). Anal. Found: C, 54.27; H, 5.28; F, 30.81. From the % H, the composition of the polymer was calculated as 49 mol % TFE and 51 mol % norbornene.

Example 2

Synthesis of TFE/Norbornene Copolymer=P(TFE/NB)

A 400 mL stainless steel pressure vessel was charged with a solution of 33 g (0.35 mol) norbornene in 120 mL of CFC-113. Perkadox® 16 N (1.20 g) was added. The vessel was closed, purged with nitrogen, cooled, evacuated and charged with 40 g (0.40 mol) TFE. The vessel was heated with shaking to 50° C. and maintained for 18 hr with the internal pressure decreasing from 200 psi to 167 psi. The vessel was cooled, vented and the liquid contents recovered using additional CFC-113 to rinse. Polymer was isolated by precipitation of the CFC-113 solution into excess methanol. The white solid was filtered and dried in a vacuum oven overnight at about 65° C. Isolated yield was 29.7 g (41%) of white polymer; GPC (MEK) Mw 10000, Mn 2900, Mw/Mn 3.57; Inh. Visc. 0.0130 (MEK). Anal. Found: C, 54.60; H, 5.05; F, 31.21. From the % C, the composition of the polymer was calculated as 52 mol % TFE and 48 mol % norbornene.

Example 3

Synthesis of TFE/Norbornene Copolymer=P(TFE/NB)

The procedure of Example 2 was followed using 47 g (0.5 mol) norbornene, 120 mL CFC-113, 1.6 g Perkadox® 16N and 50 g (0.50 mol) TFE with polymerization conducted at 40° C. for 18 hr. There was isolated 19.7 g (20%) of white polymer; GPC (MEK) Mw 10600, Mn 3700; Mw/Mn 2.89; Inh. Visc. 0.0195 (MEK); Tg 152° C. (DSC). Anal. Found: C, 58.33; H, 5.63; F, 33.13. From the % C analysis, composition of the polymer was calculated as 46 mol % TFE and 54 mol % norbornene.

Example 4

Synthesis of TFE/Norbornene Copolymer=P(TFE/NB)

The procedures and reagents from Example 3 were followed with the polymerization conducted at 50° C. There was isolated 34 g (35%) of white polymer; GPC (MEK) Mw 6000, Mn 2500, Mw/Mn 2.38; Inh. Visc. 0.048 (MEK); Tg 151° C. (DSC). Anal. Found: C, 56.60; H, 5.38; F, 31.57. From the % C analysis, composition of the polymer was calculated as 49 mol % TFE and 51 mol % norbornene.

Example 5

Synthesis of TFE/Norbornene Copolymer=P(TFE/NB)

The procedure of Example 2 was followed using 42.3 g (0.45 mol) norbornene, 100 mL of CFC-113, 1.5 g Perkadox® 16N and 50 g (0.50 mol) TFE. There was isolated 36 g (39%) of white polymer; GPC (MEK) Mw 6700, Mn 2800, Mw/Mn 2.37; Inh. Visc. 0.035 (MEK); Tg 151° C. (DSC). Anal. Found: C, 54.11; H, 5.36; F, 32.83. From the % C analysis, composition of the polymer was calculated as 52 mol % TFE and 48 mol % norbornene.

Example 6

Synthesis of TFE/Norbornene Copolymer=P(TFE/NB)

The procedure of Example 2 was followed using 28.2 g (0.30 mol) norbornene, 100 mL of CFC-113, 1.5 g Perkadox® 16N and 70 g (0.70 mol) TFE. There was isolated 58.7 g (60%) of white polymer; GPC (MEK) Mw 24200, Mn 8700, Mw/Mn 2.79; Inh. Visc. 0.037 (MEK); Tg 146.5° C. (DSC). Anal. Found: C, 50.60; H, 4.51; F, 37.34. From the % C analysis, composition of the polymer was calculated as 58 mol % TFE and 42 mol % norbornene.

Example 7

Synthesis of TFE/Norbornene/VAc Terpolymer=P(TFE/NB/VAc)

The procedure of Example 2 was followed using 37.6 g (0.40 mol) norbornene, 8.6 g (0.1 mol) VAc, 120 mL of CFC-113, 1.6 g of Perkadox® 16N and 50 g of TFE. There was isolated 45.9 g (48%) of white polymer; GPC (MEK) Mw 16600, Mn 4300; Mw/Mn 3.84; Inh. Visc. 0.0489 (MEK); Tg 124.3° C. (DSC). Anal. Found: C, 53.07; H, 4.99; F, 29.63. $^{13}$C NMR ($\delta$, TCB) 168 (C=O), 112 to 126 ($CF_2$), 62 to 80 (CH), 20 to 50 (remaining carbons). From integration of appropriate peaks in this spectrum, the polymer was found to contain 41 mol % TFE, 46 mol % norbornene and 12 mol % VAc.

Example 8

Synthesis of TFE/Norbornene/VAc Terpolymer=P(TFE/NB/Vac)

The procedure of Example 2 was followed using 28.2 g (0.30 mol) norbornene, 12.9 g (0.15 mol) VAc, 100 mL of CFC-113, 1.5 g of Perkadox® 16N and 50 g of TFE. There was isolated 55.1 g (60%) of white polymer; GPC (MEK) Mw 15200, Mn 6300; Mw/Mn 2.4; Inh. Visc. 0.0531 (MEK); Tg 101.3° C. (DSC). Anal. Found: C, 50.98; H, 5.00; F, 31.59. $^{13}$C NMR ($\delta$, TCB) 168 (C=O), 112 to 126 ($CF_2$), 62 to 80 (CH), 20 to 50 (remaining carbons). From integration of appropriate peaks in this spectrum, the polymer was found to contain 43 mol % TFE, 38 mol % norbornene and 20 mol % VAc.

Example 9

Synthesis of TFE/Norbornene/VAc Terpolymer=P(TFE/NB/VAc)

The procedure of Example 2 was followed using 21.2 g (0.225 mol) norbornene, 19.4 g (0.225 mol) VAc, 100 mL of CFC-113, 1.5 g of Perkadox® 16N and 50 g of TFE. There was isolated 57.2 g (63%) of white polymer; GPC (MEK) Mw 22000, Mn 7900; Mw/Mn 2.8; Inh. Visc. 0.0694 (MEK); Tg 91.7° C. (DSC). Anal. Found: C, 48.62; H, 4.74; F, 29.98. $^{13}$C NMR ($\delta$, TCB) 168 (C=O), 112 to 126 ($CF_2$), 62 to 80 (CH), 20 to 50 (remaining carbons). From integration of appropriate peaks in this spectrum, the polymer was found to contain 43 mol % TFE, 28 mol % norbornene and 29 mol % VAc.

Example 10

Synthesis of TFE/Norbornene/VAc Terpolymer=P(TFE/NB/VAc)

The procedure of Example 2 was followed using 14.1 g (0.15 mol) norbornene, 25.8 g (0.30 mol) VAc, 100 mL of CFC-113, 1.5 g of Perkadox® 16N and 50 g of TFE. There was isolated 72.7 g (81%) of white polymer; GPC (MEK) Mw 34600, Mn 12300; Mw/Mn 2.8; Inh. Visc. 0.156 (MEK); Tg 75.6° C. (DSC). Anal. Found: C, 44.24; H, 3.99; F, 36.90.

Example 11

Synthesis of TFE/Norbornene/Ethylene Terpolymer=P(TFE/NB/E)

A 400 mL stainless steel pressure vessel was charged with 14.1 g (0.15 mol) norbornene, 100 mL CFC-113 and 1.13 g Perkadox® 16N. The vessel was closed, purged with nitrogen, cooled, evacuated and charged with 4.2 g (0.15 mol) ethylene and 45 g (0.45 mol) tetrafluoroethylene. The vessel was heated to 50° C. and shaken for 18 hr. The vessel was cooled to room temperature, vented and the contents were recovered as a clear liquid using additonal CFC-113 to rinse. The polymer was precipitated by adding the CFC-113 solution to excess methanol. The solid was filtered and dried in a vacuum oven at 65° C. overnight. There was isolated 33.8 g (53%) of white polymer; GPC (MEK) Mw 18600, Mn 8600, Mw/Mn 2.17; Inh. Visc. 0.0892 (MEK); Tg 92.1° C. Anal. Found: C, 50.15; H, 4.73, F, 39.91.

Example 12

Synthesis of TFE/Norbornene/Ethylene Terpolymer=P(TFE/NB/E)

The procedure of Example 11 was followed using 18.8 g (0.20 mol) norbornene, 100 mL CFC-113, 1.5 g Perkadox® 16N, 5.6 g (0.20 mol) ethylene and 60 g (0.60 mol) tetrafluoroethylene. The product mixture was a milky solution which was added to excess methanol to precipitate the polymer. There was isolated 55.9 g (66%) of white polymer; GPC (MEK) Mw 22200, Mn 10300, Mw/Mn 2.15; Inh. Visc. 0.0940 (MEK); Tg 98.7° C. Anal. Found: C, 47.80; H, 4.39, F, 42.79.

Example 13

Synthesis of TFE/Norbornene/Ethylene Terpolymer=P(TFE/NB/E)

The procedure of Example 11 was followed using 28.2 g (0.20 mol) norbornene, 100 mL CFC-113, 1.5 g Perkadox® 16N, 2.8 g (0.10 mol) ethylene and 60 g (0.60 mol) tetrafluoroethylene. The product mixture was a clear solution which was added to excess methanol to precipitate the polymer. There was isolated 41.0 g (45%) of white polymer; GPC (MEK) Mw 16400, Mn 7000, Mw/Mn 2.3; Inh. Visc. 0.0660 (MEK); Tg 131.9° C. Anal. Found: C, 52.01; H, 4.85, F, 34.55.

Example 14

Synthesis of TFE/Norbornene/Ethylene/tert-Butyl Acrylate Tetrapolymer=P(TFE/NB/E/tBA)

The procedure of Example 11 was followed using 23.5 g (0.25 mol) norbornene, 6.4 g (0.05 mole) tert-butyl acrylate, 100 mL CFC-113, 1.5 g Perkadox® 16N, 2.8 g (0.10 mol) ethylene and 60 g (0.6 mol) tetrafluoroethylene. The product mixture was a clear liquid which was added to excess methanol to precipitate the polymer. There was isolated 35.8 g (39%) of white polymer; GPC (MEK) Mw 13700, Mn 7000, Mw/Mn 1.96; Inh. Visc. 0.0830; Tg 108° C. Anal. Found: C, 57.47; H, 6.11; F, 24.40. Full polymer composition could not be determined by $^{13}$C NMR due to overlapping resonances. However, the mole ratio of TFE to tert-butyl acrylate was found to be 3.0 to 1.0 from integration of peaks at 112 to 124 ppm ($CF_2$) versus 80 ppm (CH).

Example 15

Synthesis of TFE/Norbornene/tert-Butyl Acrylate Terpolymers=P(TFE/NB/tBA)

The procedure of Example 2 was followed using 33.9 g (0.35 mol) norbornene, 6.4 g (0.05 mol) tert-butyl acrylate, 100 mL CFC-113, 1.5 g Perkadox® 16N and 60 g (0.60 mol) of tetrafluoroethylene. The product mixture was a clear liquid which was added to excess methanol to precipitate the polymer. There was isolated 27.8 g (28%) of white polymer; GPC (MEK) Mw 11100, Mn 5600, Mw/Mn 1.99; Inh Visc. 0.0462 (MEK); Tg 130° C. Anal. Found: C, 60.39; H, 6.72; F, 28.00. $^{13}$C NMR (δ, TCB) 166 to 178 (C=O), 112 to 124 ($CF_2$), 80 (CH), 22 to 54 (remaining carbons). From integrations of appropriate resonances, the polymer composition was found to be 36 mol % TFE, 17 mol % tert-butyl acrylate and 47 mol % norbornene.

Example 16

Synthesis of TFE/Norbornene/tert-Butyl Acrylate Terpolymers=P(TFE/NB/tBA)

The procedure of Example 2 was followed using 28.2 g (0.30 mol) norbornene, 12.8 g (0.05 mol) tert-butyl acrylate, 100 mL CFC-113, 1.5 g Perkadox® 16N and 60 g (0.60 mol) of tetrafluoroethylene. The product mixture was a clear liquid which was added to excess methanol to precipitate the polymer. There was isolated 28.8 g (29%) of white polymer; GPC (MEK) Mw 16100, Mn 7500, Mw/Mn 2.15; Inh Visc. 0.0862 (MEK); Tg 115° C. Anal. Found: C, 62.32; H, 7.53; F, 18.98. $^{13}$C NMR (δ, TCB) 166 to 178 (C=O), 112 to 124 ($CF_2$), 80 (CH), 22 to 54 (remaining carbons). From integrations of appropriate resonances, the polymer composition was found to be 28 mol % TFE, 34 mol % tert-butyl acrylate and 38 mol % norbornene.

Example 17

Synthesis of TFE/Norbornene/5-Norbornene-2-carboxylic Acid tert-butyl ester Terpolymer=P(TFE/NB/5-NB-2-CO2tBu)

5-norbornene-2-carboxylic acid, tert-butyl ester was prepared as a comonomer for this polymer synthesis example using the procedure which follows: To a single neck 300 mL round bottom flask was added a solution of freshly cracked cyclopentadiene (15.5 g, 230 mmol) and tert-butyl acrylate (29.4 g, 229 mmol) in xylene (85 g). The reaction mixture was heated at reflux for 8 hours under nitrogen; the product was then fractionally distilled using a spinning band distillation column (boiling point 44–46° C. @0.4–0.5 mm Hg). Yield of 5-norbornene-2-carboxylic acid, tert-butyl ester was 30 g (67%).

The polymerization procedure of Example 2 was followed using 37.6 g (0.40 mol) norbornene, 19.4 g (0.10 mol)

5-norbornene-2-carboxylic acid, tert-butyl ester, 1.6 g Perkadox® 16N, 120 mL CFC-113 and 50 g (0.50 mol) TFE. The product mixture was a clear liquid which was added to excess methanol to precipitate the polymer. There was isolated 18.6 g (17%) of white polymer; GPC (MEK) Mw 4300, Mn 2300, Mw/Mn 1.9; Inh. Visc. 0.040 (MEK); Tg 171° C. Anal. Found: C, 59.26; H, 6.00; F, 29.16. From integrations of appropriate $^{13}$C NMR resonances, the polymer composition was found to be 42 mol % TFE, 17 mol % 5-norbornene-2-carboxylic acid tert-butyl ester and 41 mol % norbornene.

Example 18

Synthesis of TFE/Norbornene/5-Norbornene-2-carboxylic acid Terpolymer=P(TFE/NB/5-NB-2-CO2H)

The procedure of Example 2 was followed using 37.6 g (0.40 mol) norbornene, 13.8 g (0.10 mol) 5-norbornene-2-carboxylic acid, 120 mL CFC-113, 1.6 g Perkadox® 16N and 50 g (0.50 mol) TFE. The product mixture was a clear liquid which was concentrated in vacuum to about 2⁄3 of the original volume and added to excess methanol to precipitate the polymer. The white solid was washed with several portions of methanol and dried. There was isolated 6.8 g (6.7%) of white polymer; GPC (MEK) Mw 3800, Mn 2400, Mw/Mn 1.6; Inh. Visc. 0.0373 (MEK); Tg 166° C. Anal. Found: C, 58.07; H, 5.59; F, 30.73. From integrations of appropriate $^{13}$C NMR resonances, the polymer composition was found to be 41 mol % TFE, 8 mol % 5-norbornene-2-carboxylic acid and 51 mol % norbornene.

Example 19

Synthesis of TFE/Norbornene/Acrylic Acid Terpolymer=P(TFE/NB/AA)

The procedure of Example 2 was followed using 37.6 g (0.040 mol) norbornene, 7.2 g (0.10 mol) acrylic acid, 1.5 g Perkadox® 16N, 100 mL CFC-113 and 50 g (0.50 mol) TFE. Product mixture consisted of a clear liquid, a cloudy liquid underneath and a white solid on the surface. The well agitated mixture was added in small portions to excess hexane to precipitate polymer. There was isolated 18.9 g (20%) of white polymer; GPC (THF) Mw 9700; Mn 5300; Mw/Mn 1.8; Inh. Visc. 0.157 (THF); Tg 165.3° C. Anal. Found: C, 58.60; H, 6.20; F, 18.95.

Example 20

Synthesis of TFE/1-Adamantanecarboxylate Vinyl Ester Dipolymer=P(TFE/1-AdCO2CH=CH2)

The synthesis of 1-adamantanecarboxylate vinyl ester has been described by S. Nozakura et al., in *J. Polym. Sci., Polym. Chem. Ed.*, Vol. 11, pages 1043–11051 (1973). This compound was prepared from 1-adamantanecarboxylic acid (Aldrich Chemical Co.) and vinyl acetate using a catalyst of bipyridine palladium diacetate and ethybenzenesulfonic acid according to the procedure disclosed in F. J. Waller, U.S. Pat. No. 5,214,172 (1993).

A 200 mL stainless steel pressure vessel was charged with 8.2 g (0.04 mol) of 1-adamantane carboxylic acid, vinyl ester, 40 mL of tert-butanol, 20 mL of methyl acetate, and 0.1 g Vazo® 52. The vessel was closed, purged with nitrogen, cooled, evacuate and charged with 6 g (0.06 mol) tetrafluoroethylene. The vessel contents were agitated for 18 hr at 50° C. The vessel was cooled to room temperature and vented. The vessel contents were transferred to a glass jar using acetone to rinse. The product mixture was a cloudy solution containing a gummy solid. This mixture was added to excess methanol and the white precipitate solid was filtered off and dried in a vacuum oven overnight. There was isolated 3.7 g (26%) of white polymer; GPC (THF) Mw 48700, Mn 23400, Mw/Mn 2.08; Tg 151° C. Anal. Found: C, 63.85; H, 6.98; F, 16.82. From the % C analysis, the polymer composition was calculated to be 38 mole % TFE and 62 mole % adamantane carboxylic acid, vinyl ester.

Example 21

Synthesis of TFE/Norbornene/Vinyl Alcohol Terpolymer=P(TFE/NB/VOH)

A 20 g portion of the polymer prepared in Example 8 was dissolved in 200 mL of THF with stirring and heated to about 60° C. A solution of 5 g of sodium hydroxide pellets dissolved in 15 mL water and 15 mL methanol was added in portions over 0.5 hr. The resulting solution was heated at a gentle reflux for 4 hr. After standing at room temperature overnight, the solution was added to excess 1N aqueous hydrochloric acid and ice. The precipitated polymer was filtered, washed with several portions of water and dried in a vacuum oven with nitrogen purge at 70–75° C. overnight. There was isolated 16.7 g of white polymer; GPC (THF) Mw 11700, Mn 3600, Mw/Mn 3.25; Inh. Visc. 0.0901 (THF); Tg 115.8° C. Anal. Found: C, 52.92; H, 5.34; F, 33.52.

Example 22

Measurement of Plasma Etch Rates

Polymer samples were dissolved in PGMEA or chlorobenzene, spin coated at 3000 rpm for 1 min onto silicon wafers and the coated wafer then baked on a hot plate for 50 sec at 90° C. The plasma etch resistance of the spin coated polymers was then evaluated by exposure to a $CF_4/O_2$ plasma (pressure=150 mtorr, $CF_4/O_2$=40/7.1 sccm, source power=300 W, 483 V DC Bias). The plasma etch rate was determined by protecting a portion of the coated wafer with a microscope slide or cover slip; the wafer was then exposed to the $CF_4/O_2$ plasma for a given length of time and the thickness change of the unprotected resist vs. resist protected under the glass slide measured using an Alpha-Step 200 Stylus Profilometer with a 5µ tip stylus. The etch rate was usually measured at two different exposure times (e.g. 1.5 min and 3.0 min) and found to differ slightly. For comparison purposes, results obtained for a commercial Novolak resin (Borden Inc.) at two different exposure times are included. Etch rates reported relative to Novolak use the "better" of the two Novolak etch rates (i.e., 1716 Å/min).

| Copolymer (Example #) | Spinning solvent | Concentration of spinning sample | Exposure time in $CF_4/O_2$ plasma (min) | Etch Rate (A/min) | Etch rate relative to Novolak |
|---|---|---|---|---|---|
| Borden Novolak PD-124-C | PGMEA/ Acetone (55:45) | 27 wt. % | 3.0 | 1716 | — |
|  |  |  | 1.5 | 1935 | — |
| TFE/NB (Example 1) | PGMEA | 33 | 6.0 | 2139 | 1.2 |
| TFE/NB (Example 2) | Chlorobenzene | 32 | 3.0 | 1375 | 0.8 |
|  |  |  | 1.5 | 1599 | 0.9 |
| TFE/NB (Example 3) | Chlorobenzene | 9 | 1.0 | 1250 | 0.7 |
| TFE/NB/VAc (Example 7) | Chlorobenzene | 32 | 3.0 | 2134 | 1.2 |
|  |  |  | 1.5 | 2323 | 1.4 |
| TFE/NB/VAc (Example 8) | Chlorobenzene | 28 | 3.0 | 2843 | 1.7 |
|  |  |  | 1.5 | 2330 | 1.4 |
| TFE/NB/VAc (Example 9) | Chlorobenzene | 35 | 3.0 | 2886 | 1.7 |
|  |  |  | 1.5 | 2532 | 1.5 |
| TFE/NB/E/ $^t$Bu Acrylate (Example 14) | Chlorobenzene | 33 | 3.0 | 1287 | 0.8 |
|  |  |  | 1.5 | 1363 | 0.8 |
| TFE/NB/ $^t$Bu Acrylate (Example 15) | Chlorobenzene | 33 | 3.0 | 1881 | 1.1 |
|  |  |  | 1.5 | 2043 | 1.2 |
| TFE/NB/ $^t$Bu Acrylate (Example 16) | Chlorobenzene | 33 | 3.0 | 2055 | 1.2 |
|  |  |  | 1.5 | 2357 | 1.4 |
| TFE/NB/ NB—$CO_2{}^t$Bu (Example 17) | Chlorobenzene | 33 | 3.0 | 2350 | 1.4 |
|  |  |  | 1.5 | 2547 | 1.5 |
| TFE/NB/ NB—$CO_2$H (Example 18) | PGMEA | 33 | 3.0 | 1990 | 1.2 |
|  |  |  | 1.5 | 1869 | 1.1 |

Example 23

Measurement of Optical Transparency at 248 and 193 nm

Films of the P(TFE/NB) copolymer from Example 2 and the P(TFE/NB/NB-$CO_2{}^t$Bu) terpolymer from Example 17 were spin coated onto quartz substrates at speeds of 3500–5500 rpm from solutions in chlorobenzene, and were dried in a vacuum oven at 100° C. for 16 hours in order to remove residual solvent (chlorobenzene), which strongly absorbs in the UV. Film thicknesses were about 2 $\mu$m, independent of the speed at which the films were spun. The UV absorbance spectra ($\mu m^{-1}$) of the two films are shown in FIG. 1. The optical absorption of both resins is negligible at 248 nm. Both resins have very low absorptions at 193 nm (<0.2 $\mu m^{-1}$ (of film thickness)), which would still allow them and/or related materials to be used as photoresists at this wavelength.

Example 24

A photoresist composition was made at 32.3% solids level as summarized below:

| Component | Wt. (gm) |
|---|---|
| (Copolymer from Example 15) 36/47/17 (mole %) TFE/NB/tBA | 9.9 |
| Chlorobenzene | 19.5 |
| Mixed triaryl sulfonium hexafluoroantimonate salts: 4-thiophenoxyphenyl diphenyl sulfonium hexafluoro- antimonate and bis(4-(diphenylsulfonio)-phenyl)- sulfide-bis-hexafluoroantimonate [Sartomer SarCat ™ CD-1010, 50% solids solution in propylene carbonate, Sartomer Co., Exton, PA] | 1.2 |
| Methyl ethyl ketone (MEK) | 2.0 |

This solution was magnetically stirred overnight. Spin coating was done using a Brewer Science Inc. Model-100CB combination spin coater/hotplate on a 6 in diameter silicon wafer, Type "P", 1.00 orient. Development was performed on Litho Tech Japan, Resist Development Analyzer (RDA-790).

The wafer was prepared by depositing 6.0 ml of hexamethyldisilazane (HMDS) primer and spinning at 1000 rpm for 5 seconds. Then 6.0 ml of the above solution was deposited and spun at 4500 rpm for 60 seconds and baked at 90° C. for 60 seconds. The coating was imagewise exposed to broadband UV light (350 to 450 nm) with an ORIEL Model-82421 Solar Simulator (1000 watt) for 15 seconds, which provided a dose of 19.7 mJ/$cm^2$, and subsequently baked at 90° C. for 90 seconds through a UV photomask on quartz (mask which is effective in blocking UV light in masked portions throughout the UV). The imaged coating was developed for 15 seconds at 23° C. in TMAH solution (ONKA NMD-3, 2.38 weight % of TMAH) to give a positive image.

Example 25

A photoresist composition is made to 33% solids level in chlorobenzene to afford a coating solution. Solid components of the composition are P(TFE/NB/tBA) from Example 15 (70.5 grams), t-butyl deoxycholate (28 grams), and triphenylsulfonium hexafluorantimonate (1.5 grams). This resist solution is spin coated onto a 6" diameter silicon wafer and dried at 150° C. The resist is digitally imaged using an ArF laser which outputs 193 nm UV light at a level 5 mJ/cm² and then baked at 90° C. for 90 seconds. The resulting image-wise exposed resist sample is then subjected to development using 0.262 N tetrabutylammonium hydroxide for 1 minute. Development results in the UV-exposed resist portions being removed while the UV-unexposed portions remain, which thereby affords a high resolution and high contrast relief image of the positive-working resist.

Example 26

This example is the same as Example 25 except that P(TFE/NB/5-NB-2-CO₂ᵗBu) from Example 17 is used in place of P(TFE/NB/tBA). There results a high resolution and high contrast relief image of this positive-working resist.

Example 27

P(TFE/NB/tBA/M) copolymer of composition 36 mol % TFE, 17 mol % tert-butyl acrylate, 10 mol % acrylic acid, and 37 mol % norbornene is synthesized following the general procedure given in Example 15 using the four comonomers—TFE, tBA, M, and NB. This example is the same as Example 25 except that P(TFE/NB/tBA/AA) is used in place of P(TFE/NB/tBA). There results a high resolution and high contrast relief image of this positive-working resist.

Examples 28–30

These examples are the same as and correspond to Examples 25–27, respectively, except that in each of these examples, imaging is effected using 157 nm UV light from a F₂ excimer laser at a level of 5 mJ/cm² (instead of 193 nm UV light). There results a high resolution and high contrast relief image of this positive-working resist.

Example 31

This example illustrates negative-working imaging of a silicon wafer with a resist comprised of TFE/NB/tBA copolymer, wherein the resist is developed with an organic solvent.

| Component | Wt. (gm) |
| --- | --- |
| (Copolymer prepared analogously to copolymers from Examples 15 and 16) 22/36/42 (mole %) TFE/NB/tBA | 2.6 |
| Propylene glycol methyl ether acetate (PGMEA) | 8.3 |
| 5% (wt) Solution of Sartomer SarCat CD-1012 in PGMEA that was filtered through a 0.45 μ PTFE syringe filter [SarCat CD-1012 is a solid diaryl iodonium hexafluoroantimonate salt-[4-(2-hydroxy-1-tetradecyloxy)phenyl]phenyl iodonium hexafluoroantimonate] | 2.8 |

The above components were mixed, and the resulting solution was magnetically stirred overnight. Spin coating was done using a Brewer Science, Inc. Model-100CB combination spin coater/hotplate on a 5 inch diameter silicon wafer, Type "P", 1.00 orient. The silicon wafer was prepared by depositing 6 ml of hexamethyldisilazane (HMDS) primer and spinning at 1000 rpm for 5 seconds and then 3500 rpm for 10 seconds. Then 6 ml of the above solution was deposited and spun at 2000 rpm for 60 seconds and baked at 110° C. for 60 seconds. Half the coated wafer was exposed for 60 seconds to 248 nm light obtained by passing broadband UV light from an ORIEL Model-82421 Solar Simulator (1000 watt) through a 248 nm interference filter which passed about 30% of the energy at 248 nm. The wafer was then baked at 110° C. for 120 seconds. The wafer was developed by dipping for 60 seconds in chlorobenzene at ambient temperature and resulted in a negative-working image being produced (i.e., the portion(s) of the coated wafer that had been exposed to 248 nm light was insoluble in the developer and remained on the wafer, while the portion(s) of the coated wafer that had not been exposed to 248 nm light were soluble/dispersible in the developer and were removed during the course of development resulting in the negative-working image being produced).

Example 32

This example further illustrates negative-working imaging of a silicon wafer with a resist comprised of TFE/NB/tBA copolymer, wherein the resist is developed with an organic solvent.

| Component | Wt. (gm) |
| --- | --- |
| (Copolymer prepared analogously to copolymers from Examples 15 and 16) 20/51/29 (mole %) TFE/NB/tBA | 3.8 |
| Cyclohexanone | 12.1 |
| 5% (wt) Solution of Sartomer SarCat CD-1012 in cyclohexanone that was filtered through a 0.45 u PTFE syringe filter. [SarCat CD-1012 is a solid diaryl iodonium hexafluoroantimonate salt-[4-(2-hydroxy-1-tetradecyloxy)phenyl] phenyl iodonium hexafluoroantimonate] | 4.1 |

The above components were mixed, and the resulting solution was processed in the same manner as in Example 31, including development in chlorobenzene. There resulted in a negative-working image being produced upon development in chlorobenzene.

Example 33

A 45/5/50 (mole %) copolymer of tetrafluoroethylene (TFE), tert-butyl acrylate (tBA), and the partially fluorinated bicyclic comonomer "A" shown below is synthesized following the general procedure given in Example 15. The copolymer is formulated into a photoresist by dissolving it into chlorobenzene solvent to give a 25 weight % solution, and adding 1 weight % (vs. copolymer) of a photoacid generator, which is triphenylsulfonium hexafluoroantimonate. The resist solution is spin coated onto a 6" diameter silicon wafer and dried at 150° C. The resist composition is exposed to 193 nm UV light (at a level of 5 mJ/cm² from a ArF laser) through a mask. The exposed wafer is then baked at 90° C. for 90 seconds, and then developed in critical CO₂ at 4,000 psi pressure and 80° C. for 10 minutes. Development results in the unexposed portions being removed while the UV-exposed portions remain, which thereby affords a high resolution and high contrast negative-working image.

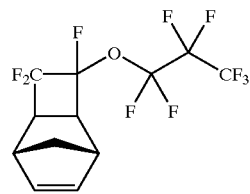

Bicyclic Comonomer "A"

Comonomer A is prepared by reaction of perfluoropropylvinyl ether (1 equivalent) with norbornadiene (4 equivalents) for 24 hours at 190° C. in a sealed metal pressure vessel. Liquid product is purified by spinning band distillation to afford pure cuts of the bicyclic comonomer "A" (and having boiling point=118° C. @99 mm).

Example 34

The resist solution from Example 33 is spin coated onto a 6" diameter silicon wafer and dried at 150° C. The resist composition is exposed to 193 nm UV light (at a level of 5 mJ/cm² from a ArF laser) through a mask. The exposed wafer is then baked at 90° C. for 90 seconds, and then developed in $CF_3CFHCFHCF_2CF_3$ (Vertrel XF®, commercially available from E.I. du Pont de Nemours and Company, Wilmington, Del.) for 1 minute at 25° C. Development results in the unexposed portions being removed while the UV-exposed portions remain, thereby affording a high resolution and high contrast image from this negative-working photoresist.

Example 35

Synthesis of 1-Adamantanemethylvinyl Ether

A suspension of 1-adamantanemethanol (71 g, 0.43 mol) (Aldrich Chemical Company) and 1.0 g of mercuric acetate in 150 g of ethylvinyl ether was refluxed under nitrogen overnight. The resulting mixture was concentrated at 50° C. and 0.5 mm to a solid. The solid was suspended in 150 g ethylvinyl ether with 1.0 g of mercuric acetate and refluxed for about 72 hr giving a clear solution. This was concentrated as above and the residue was mixed with another 150 g portion of ethylvinyl ether and refluxed overnight. This solution was concentrated as above. The residue was dissolved in 250 mL of hexane and washed with 2×50 mL of 5% aqueous potassium carbonate solution. The hexane solution was dried over magnesium sulfate, filtered and treated with 1.5 g of calcium hydride to convert any remaining alcohol to a nonvolatile salt. The solution was concentrated on a rotary evaporator and the residue was distilled in a Kugelrohr apparatus at 65–75° C. and 0.5 mm giving 67.2 g (81%) of white solid, mp 41–42° C. $^1$H NMR ($\delta$, $CD_2Cl_2$) 1.5 (s), 1.6 (m) and 1.8 (m) (15 H), 3.2 (s, 2H), 3.9 (d, 1H), 4.1 (d, 1H), 6.5 (dd, 1H). Anal. Calcd for $C_{13}H_{20}O$: C, 81.20; H, 10.48; O, 8.32%. Found: C, 81.22; H, 9.85; O, 8.07%.

Example 36

Synthesis of 2-Norbornanemethylvinyl Ether

A dry 1-L round bottom flask with condenser, thermocouple and magnetic stirrer was swept with nitrogen and charged with 76.8 g (0.61 mol) of 2-norbornanemethanol (Aldrich Chemical Company), 93.6 g (1.3 mol) of ethylvinyl ether (Aldrich Chemical Company) and 2.23 g of mercuric acetate. The resulting mixture was maintained at reflux for 48 hr. The excess ethylvinyl ether was evaporated under reduced pressure. The residue was dissolved in hexane and passed through a 5.5×35 cm column of silica gel eluting with hexane. The desired fractions were combined and concentrated under reduced pressure. The residue was distilled in a Kugelrohr apparatus at 45° C. and 0.1 mm pressure to give 49 g (53%) of colorless liquid. $^1$H NMR ($\delta$, $CD_2Cl_2$) 0.56–3.6 (complex multiplets, 13 H), 3.98 (d, 1H), 4.21 (d, 1H), 6.47 (dd, 1H). Anal. Calcd for $C_{10}H_{16}O$: C, 78.90; H, 10.59; O, 10.51. Found: C, 78.70; H, 10.67; O, 10.21%.

Example 37

Synthesis of TFE/1-Adamantanemethylvinyl Ether Copolymer=P(TFE/AdVE)

The procedure of Example 20 was followed using 19.0 g (0.10 mol) of 1-adamantanemethylvinyl ether, 0.1 g of potassium carbonate, 60 mL of tert-butanol, 0.3 g of Vazo® 52 and 15 g (0.15 mol) of TFE. The product consisted of a white solid in a cloudy liquid. The liquid was decanted and the solid was dissolved in 200 mL of THF. The THF solution was added slowly to excess methanol to precipitate the polymer. The white solid was filtered, washed with methanol and dried in a vacuum oven at room temperature overnight. There was isolated 21.1 g (62%) of white polymer; GPC (THF) $M_n$ 37300, $M_W$ 240600, $M_W/M_n$ 6.5; Tg 121.4° C. Anal.: Found: C, 61.04; H, 6.69; F, 22.32%. From the percentage of carbon, the polymer is calculated to comprise 51 mole % of TFE and 49 mole % of AdVE.

Example 38

Synthesis of TFE/2-Norbornanemethylvinyl Ether Copolymer=P(TFE/NbVether)

The procedure of Example 20 was followed using 15.2 g (0.10 mol) of 2-norbornanemethylvinyl ether, 0.1 g of potassium carbonate, 60 mL of tert-butanol, 0.3 g of Vazo® 52 and 15 g (0.15 mol) of TFE. The product consisted of a white solid in a cloudy liquid. The liquid was decanted and the solid was dissolved in 150 mL of THF. The THF solution was added slowly to excess methanol to precipitate the polymer. The white solid was filtered, washed with methanol and dried in a vacuum oven at room temperature overnight. There was isolated 23.7 g (74%) of white polymer; GPC (THF) $M_n$ 57400, $M_W$ 247000, $M_W/M_n$ 4.3; Tg 66° C. Anal.: Found C, 56.57%; H, 6.32; F, 23.97%. From the percentage of carbon, the polymer is calculated to comprise 51 mole % of TFE and 49 mole % of NbVether.

Example 39

Copolymerization of TFE, Norbornene and

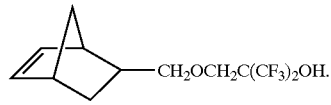

A 200 mL pressure vessel was charged with 14.1 g (0.15 mol) of norbornene, 45.6 g (0.15 mol) of the hexafluoroisopropanol-substituted norbornene, 75 mL of 1,1,2-trichlorotrifluoroethane and 1.2 g of Perkadox®16N. The vessel was closed, cooled in dry ice, evacuated and charged with 45 g (0.45 mol) of tetrafluoroethylene. The vessel contents were heated with agitation to 50° C. and maintained for 18 hr. The vessel was cooled to room temperature and vented. The polymer solution was added slowly to excess hexane. The precipitate was dried in a vacuum oven at about 50° C. giving 3.5 g of polymer. $^1$H NMR ($\delta$, THF-d8) 0.6–4.0 (complex pattern). $^{19}$F NMR ($\delta$, THF-d8) −78.8 (s, $CF_3$ groups), −100 to −125 (m, $CF_2$). From the integral ratio of the $^{19}$F absorptions, the molar ratio of tetrafluoroethylene units to hexafluoroisopropanol-substituted norbornene repeat units in the polymer was determined to be 1.76:1.

Example 40

Measurement of Optical Transparency at 157 nm

Optical transparency data at 157 nm was determined using a spin-coated film sample of each of the polymer samples as shown in the table below. For each film sample, the absorbance per micron of film thickness was determined, which is designated as ABS/MICRON@157 NM in the table below. Compositions of the copolymers are given below in mole percentages of each comonomer in the order indicated.

| EXAMPLE | POLYMER | ABS/MICRON @ 157 NM |
|---|---|---|
| 2 | P(TFE/NB) (52:48) | 1.41 |
| 5 | P(TFE/NB) (52:48) | 1.34 |
| 3 | P(TFE/NB) (46:54) | 1.53 |
| 6 | P(TFE/NB) (58:42) | 1.23 |
| 15 | P(TFE/NB/tBA) (36:47:17) | 2.44 |
| 16 | P(TFE/NB/tBA) (28:38:34) | 3.60 |
| 39 | P(NBFA) | 3.00 |

Example 41

Measurement of Optical Transparency at 157 nm

Optical transparency data at 157 nm was determined using a spin-coated film sample of each of the polymer samples as shown in the table below. For each film sample, the absorbance per micron of film thickness was determined, which is designated as ABS/MICRON@157 NM in the table below. Compositions of the copolymers are given below in mole percentages of each comonomer in the order indicated.

| EXAMPLE | POLYMER | ABS/MICRON @ 157 NM |
|---|---|---|
| 37 | P(TFE/AdVE) | 2.1 |

Example 42

Synthesis of TFE/1-Adamantanemethylvinyl Ether/ $CH_2$=$CHOCH_2CH_2OCH_2C(CF_3)_2OH$/tert-Butyl Acrylate Tetrapolymer A 200 mL pressure vessel was charged with a solution of 15.4 g (0.08 mol) 1-adamantanemethylvinyl ether, 21.4 g (0.08 mol) $CH_2$=$CHOCH_2CH_2OCH_2C(CF_3)_2OH$ (synthesis used for this comonomer is provided below), 5.1 g (0.04 mol) tert-butyl acrylate, 0.5 g potassium carbonate, 60 mL tert-butanol and 15 mL isopropanol. Vazo® 52 (0.4 g) was added. The vessel was closed, purged with nitrogen, evacuated and charged with 24 g (0.24 mol) of tetrafluoroethylene. The vessel contents were agitated for 18 hr at 50° C. as the internal pressure decreased from 329 to 179 psi. The vessel was cooled to room temperature, vented and the contents recovered using acetone to rinse. The mixture was filtered, concentrated on a rotary evaporator to about 60% of its initial volume, and added slowly to a 12-fold excess of hexane. The tacky precipitate was collected and air dried at room temperature. It was dissolved in 160 mL of THF and precipitated by adding this solution slowly to an excess of cold water in a blender. The precipitated polymer was collected and dried in a vacuum oven overnight at 65–70° C. Yield was 36.7 g (56%) of a polymer foam. GPC (THF) Mn 59000, Mw 130300, Mw/Mn 2.21. $^1$H NMR (δ, THF-d8) 1.43 (s, $C(CH_3)_3$), 1.5–2.1 (m, adamantane hydrogens+ $CH_2CH$ from tert-butyl acrylate), 2.3–2.8 (broad, backbone $CH_2$ groups from vinyl ether monomers), 3.2 and 3.35 (m, $AdCH_2$), 3.7 (s, $CH_2C(CF_3)_2$), 3.9 (s, $OCH_2CH_2O$) and 4.1–4.4 (m, backbone CH from vinyl ethers). $^{19}$F NMR (δ, THF-d8) −75.7 (s, $CF_3$), −108 to −125 (M, $CF_2$). From integration of appropriate resonances in the NMR spectra, the polymer was calculated to comprise approximately 38 mole % TFE, 22 mole % 1-adamantanemethylvinyl ether, 22 mole % $CH_2$=$CHOCH_2CH_2OCH_2C(CF_3)_2OH$ and 17 mole % tert-butyl acrylate.

Anal. Found: C, 47.94; H, 5.05; F, 35.13.

Synthesis of $CH_2$=$CHOCH_2CH_2OCH_2C(CF_3)_2OH$     (2)

A dry 5-L round bottom flask equipped with mechanical stirrer, condenser and addition funnel was flushed with nitrogen and charged with 14.2 g (0.59 mol) of 95% sodium hydride and 400 mL of anhydrous DMF. This mixture was cooled to 10° C. and 41.6 g (0.47 mol) of 2-hydroxyethylvinyl ether was added dropwise over ½ hr. An additional 250 mL of DMF were added and the mixture was stirred for 1 hr. 1,1-Bis(trifluoromethyl)ethylene oxide (1, Hexafluoro-isobutylene epoxide) (85 g, 0.47 mol) was added over 1 hr at 20–23° C. The resulting suspension was stirrer for 22 hr. It was then transferred to a one-neck flask and most of the DMF was removed on a rotary evaporator at 0.1 mm and 29° C. The residue was dissolved in 250 mL of water and 10% hydrochloric acid was carefully added until the solution pH was about 8. An oil which separated was collected, washed with water and dried over a mixture of anhydrous sodium sulfate and potassium carbonate. The mixture was filtered and the filtrate was distilled in a Kugelrohr apparatus at 0.5 mm and 50–59° C. from a small amount of anhydrous potassium carbonate to give 89 g (71%) of oil which was stored over potassium carbonate and characterized to be compound 2. $^1$H NMR (δ, $C_6D_6$) 3.12 (d, 2H), 3.28 (d, 2H), 3.60 (s, 2H), 3.90 (d, 1H), 4.07 (d, 1H), 6.20 (dd, 1H). $^{19}$F NMR (δ, $C_6D_6$) −76.89 (s).

Example 43

The following solution was prepared and magnetically stirred overnight.

| Component | Wt. (gm) |
|---|---|
| TFE tetrapolymer from Example 42 | 1.30 |
| Propylene glycol methyl ether acetate (PGMEA) | 12.1 |
| t-Butyl Lithocholate | 0.45 |
| 5% (wt) solution of triphenylsulfonium triflate dissolved in cyclohexanone which was filtered through a 0.45 μ PTFE syringe filter | 1.12 |

Spin coating of the above solution was done using a Brewer Science Inc. Model-100CB combination spin coater/hotplate on a 4 in. diameter silicon wafer, Type "P", 1.00 orient. Development was performed on a Litho Tech Japan Co. Resist Development Analyzer (Model-790).

The wafer was prepared by depositing 6 ml of hexamethyldisilazane (HMDS) primer and spinning at 1000 rpm for 5 sec. and then 3500 rpm for 10 sec. Then 6 ml of the above solution, after filtering through a 0.45μ PTFE syringe filter, was deposited and spun at 5000 rpm for 60 seconds and baked at 120° C. for 60 seconds. The coated wafer was exposed to 248 nm light obtained by passing broadband UV light from an ORIEL Model-82421 Solar Simulator (1000 watt) through a 248 nm interference filter which passes about 30% of the energy at 248 nm. Exposure time was 30 seconds, providing a dose of 20.5 mJ/cm$^2$, through a mask with 18 positions of varying neutral optical density to allow various exposure doses. The exposed wafer was then baked at 120° C. for 120 seconds. The wafer was developed for 60 seconds at 23° C. in aqueous tetramethylammonium hydroxide (TMAH) solution (ONKA NMD-W, 2.38% TMAH solution) to give a positive image.

What is claimed is:

1. A fluorine-containing polymer comprising a repeat unit derived from a comonomer having the structure:

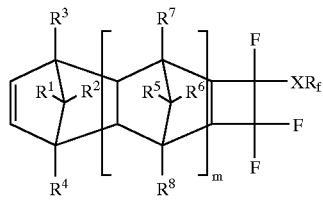

wherein m is 0, 1 or 2;

$R^1$ to $R^8$ are the same or different and each represents a hydrogen atom, a halogen atom, a carboxyl group, a hydrocarbon group of 1 to about 20 carbon atoms or a heteroatom substituted hydrocarbon group of 1 to about 20 carbon atom, the heteroatom being one or more oxygen atoms, nitrogen atoms or sulfur atoms;

X is an oxygen atom or a direct bond;

$R_f$ is a straight chain or branched perfluoroalkyl group of from 1 to 10 carbon atoms.

2. The fluorine containing polymer of claim 1 further comprising a repeat unit derived from at least one ethylenically unsaturated compound containing at least one fluorine atom covalently attached to an ethylenically unsaturated carbon atom.

3. The fluorine containing polymer of claim 2 wherein the ethylenically unsaturated compound is selected from the group consisting of tetrafluoroethylene, chlorotrifluoroethylene, hexafluoropropylene, trifluoroethylene, vinylidene fluoride, vinyl fluoride perfluoro-(2,2-perfluoro-(2-methylene-4-methyl-1,3-dioxolane),dimethyl-1,3-dioxole), $CF_2=CFO(CF_2)_tCF=CF_2$, where t is 1 or 2, and $R_fOCF=CF_2$ wherein Rf is a saturated fluoroalkyl group of from 1 to about 10 carbon atoms.

4. The fluorine containing polymer of claim 3 wherein the ethylenically unsaturated compound is tetrafluoroethylene or chlorotrifluoroethylene.

5. The fluorine containing polymer of claim 1 wherein $R_f$ is selected from the group consisting of $CF_3$, $C_2F_5$ and $C_3F_7$.

6. The fluorine-containing polymer of claim 1 wherein $R_1$–$R_8$ provides a functionality selected from the group consisting of a carboxylic acid and a protected acid group.

7. A process for preparing a photoresist image on a substrate comprising, in order:

(W) applying a photoresist composition on a substrate, wherein the photoresist composition comprises
(a) the fluorine-containing polymer of claim 1; and
(b) a photoactive component, and
(c) a solvent;

(X) drying the coated photoresist composition to substantially remove the solvent and thereby to form a photoresist layer on the substrate;

(Y) imagewise exposing the photoresist layer to form imaged and non-imaged areas; and (Z) developing the exposed photoresist layer having imaged and non-imaged areas to form a relief image on the substrate.

8. The process of claim 7 wherein the exposed layer is developed with an aqueous alkaline developer.

9. The process of claim 7 wherein imagewise exposing the photoresist layer is performed with ultraviolet radiation having wavelength of 193 nm.

10. The process of claim 7 wherein imagewise exposing the photoresist layer is performed with ultraviolet radiation having wavelength of 157 nm.

11. A photoresist comprising:

(a) a fluorine-containing polymer comprising a repeat unit derived from a comonomer having the structure:

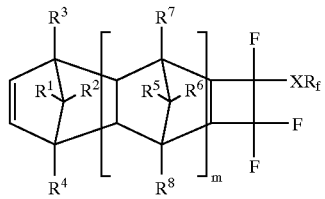

wherein m is 0, 1 or 2;

$R^1$ to $R^8$ are the same or different and each represents a hydrogen atom, a halogen atom, a carboxyl group, a hydrocarbon group of 1 to about 20 carbon atoms or a heteroatom substituted hydrocarbon group of 1 to about 20 carbon atom, the heteroatom being one or more oxygen atoms, nitrogen atoms or sulfur atoms;

X is an oxygen atom or a direct bond;

$R_f$ is a straight chain or branched perfluoroalkyl group of from 1 to about 10 carbon atoms; and (b) a photoactive component, wherein the fluorine-containing polymer contains sufficient acid functionality to render the photoresist developable so as to produce relief images, upon imagewise exposure to ultraviolet radiation having a wavelength of ≦365 nm.

12. The photoresist of claim 11 wherein the fluorine-containing polymer further comprises a repeat unit derived from at least one ethylenically unsaturated compound containing at least one fluorine atom covalently attached to an ethylenically unsaturated carbon atom.

13. The photoresist of claim 12 wherein the ethylenically unsaturated compound is selected from the group consisting of tetrafluoroethylene, chlorotrifluoroethylene, hexafluoropropylene, trifluoroethylene, vinylidene fluoride, vinyl (2,2-dimethyl-1,3-dioxole),fluoride, perfluoro-(2-methylene-4-methyl-1,3-dioxolane), $CF_2=CFO(CF_2)_tCF=CF_2$, where t is 1 or 2, and $R_fOCF=CF_2$ wherein $R_f$ is a saturated fluoroalkyl group of from 1 to about 10 carbon atoms.

14. The photoresist of claim 13 wherein the ethylenically unsaturated compound is tetrafluoroethylene or chlorotrifluoroethylene.

15. The photoresist of claim 11 wherein $R_f$ is selected from the group consisting of $CF_3$, $C_2F_5$ and $C_3F_7$.

16. The photoresist of claim 11 further comprising a solvent.

17. The photoresist of claim 11 wherein the photoactive component is a photoacid generator or a photobase generator.

18. The photoresist of claim 11 further comprising a dissolution inhibitor.

19. An article of manufacture comprising a substrate having coated thereon a photoresist comprising:

(a) a fluorine-containing polymer comprising a repeat unit derived from a comonomer having the structure:

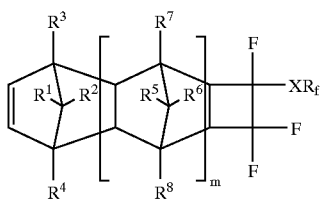

wherein m is 0, 1 or 2;

$R^1$ to $R^8$ are the same or different and each represents a hydrogen atom, a halogen atom, a carboxyl group, a hydrocarbon group of 1 to about 20 carbon atoms or a heteroatom substituted hydrocarbon group of 1 to about 20 carbon atom, the heteroatom being one or more oxygen atoms, nitrogen atoms or sulfur atoms;

X is oxygen or a direct bond;

$R_f$ is a straight chain or branched perfluoroalkyl group of from 1 to 10 carbon atoms; and (b) a photoactive component, wherein the fluorine-containing polymer contains sufficient functionality to render the photoresist developable so as to produce relief images, upon imagewise exposure to ultraviolet radiation having a wavelength of ≦365 nm.

20. The article of claim 19 wherein the substrate is a microelectronic wafer.

* * * * *

UNITED STATES PATENT AND TRADEMARK OFFICE
CERTIFICATE OF CORRECTION

PATENT NO. : 6,849,377 B2
DATED : February 1, 2005
INVENTOR(S) : Andrew Edward Feiring and Frank Leonard Schadt, III It is certified that error appears in the above-identified patent and that said Letters Patent is hereby corrected as shown below:

Column 37,
Lines 19 and 23, "20 carbon atom, the heteroatom being one more" should read
-- 20 carbon atoms, the heteroatom being one more --.

Column 40,
Line 1, "20 carbon atom, the hereoatom being one or more" should read
-- 20 carbon atoms, the heteroatom being one more --.

Signed and Sealed this

Twenty-eighth Day of February, 2006

JON W. DUDAS
*Director of the United States Patent and Trademark Office*